(12) United States Patent
Kaga

(10) Patent No.: US 11,013,148 B2
(45) Date of Patent: May 18, 2021

(54) IMAGING APPARATUS

(71) Applicant: Ryota Kaga, Tokyo (JP)

(72) Inventor: Ryota Kaga, Tokyo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/510,980

(22) Filed: Jul. 15, 2019

(65) Prior Publication Data

US 2020/0037471 A1 Jan. 30, 2020

(30) Foreign Application Priority Data

Jul. 24, 2018 (JP) .............................. JP2018-138084
Feb. 21, 2019 (JP) .............................. JP2019-029669

(51) Int. Cl.
*H05K 7/20* (2006.01)
*H04N 5/225* (2006.01)

(52) U.S. Cl.
CPC ....... *H05K 7/20436* (2013.01); *H04N 5/2252* (2013.01)

(58) Field of Classification Search
CPC .. H04N 5/2252; H04N 5/2254; H04N 5/2253; H04N 5/2251; G03B 17/02; H05K 1/189; H05K 1/14; H05K 2201/10151; H05K 1/144; H05K 2201/10121; H05K 1/0203; H05K 2201/10106; H05K 1/181; H05K 1/0201; H05K 1/027

See application file for complete search history.

(56) References Cited

U.S. PATENT DOCUMENTS

2006/0256199 A1* 11/2006 Takahashi .............. G02B 7/028
  348/207.99
2008/0156509 A1* 7/2008 Ikeo ..................... G11B 31/006
  174/50

(Continued)

FOREIGN PATENT DOCUMENTS

CN 102098433 A 6/2011
CN 202424864 U 9/2012

(Continued)

OTHER PUBLICATIONS

European Search Report dated Jan. 2, 2020 issued in corresponding European Patent Application No. 19187690.3, 16 pages.

(Continued)

*Primary Examiner* — Adam B Dravininkas
(74) *Attorney, Agent, or Firm* — Xsensus LLP

(57) ABSTRACT

An imaging apparatus includes an exterior component; an image sensor disposed inside the exterior component, the image sensor including a board; a sheet body attached to the image sensor to dissipate heat generated by the image sensors; an elastic body configured to support the sheet body; and a holder configured to hold the elastic body. The sheet body includes a heat receiver attached to the board of the image sensor; and a heat dissipating section attached to the elastic body. The elastic body is compressively deformable between the exterior component and the holder to compress the heat dissipating section against an inner surface of the exterior component.

20 Claims, 26 Drawing Sheets

(56) References Cited

U.S. PATENT DOCUMENTS

| | | | |
|---|---|---|---|
| 2008/0316344 A1* | 12/2008 | Yamamiya | G03B 17/02 348/294 |
| 2010/0061716 A1* | 3/2010 | Iyoda | H04N 5/2254 396/535 |
| 2011/0102668 A1 | 5/2011 | Kaga et al. | |
| 2011/0109790 A1 | 5/2011 | Shinohara et al. | |
| 2011/0129211 A1* | 6/2011 | Mizutani | H04N 5/2251 396/439 |
| 2011/0216237 A1 | 9/2011 | Shinohara et al. | |
| 2011/0298925 A1* | 12/2011 | Inoue | H04N 5/2251 348/148 |
| 2011/0298970 A1 | 12/2011 | Shinohara et al. | |
| 2011/0310564 A1* | 12/2011 | Yamamoto | G03B 17/02 361/707 |
| 2012/0039043 A1* | 2/2012 | Aiba | G03B 15/05 361/707 |
| 2012/0154665 A1 | 6/2012 | Kaga et al. | |
| 2012/0274840 A1* | 11/2012 | Yamano | G03B 17/02 348/373 |
| 2013/0141637 A1 | 6/2013 | Kaga | |
| 2015/0003018 A1* | 1/2015 | Takahashi | H05K 7/20454 361/704 |
| 2017/0187906 A1* | 6/2017 | Toichi | H04N 5/2251 |
| 2018/0107099 A1* | 4/2018 | Yasuda | H04N 5/22521 |
| 2018/0139867 A1 | 5/2018 | Muramatsu | |
| 2018/0224718 A1 | 8/2018 | Ota et al. | |
| 2018/0270416 A1 | 9/2018 | Kaga | |

FOREIGN PATENT DOCUMENTS

| | | |
|---|---|---|
| CN | 205670799 U | 11/2016 |
| CN | 106572621 A | 4/2017 |
| DE | 112016004957 T5 | 7/2018 |
| JP | 2012058405 A | 3/2012 |
| JP | 2014-081504 | 5/2014 |
| JP | 2014095825 A | 5/2014 |
| JP | 2015-023343 | 2/2015 |
| JP | 2016-219599 | 12/2016 |
| JP | 6080510 B2 | 2/2017 |
| JP | 2017-147682 | 8/2017 |
| WO | 2012/137586 A1 | 10/2012 |
| WO | 2017/073078 A1 | 5/2017 |

OTHER PUBLICATIONS

Extended European Search Report dated Apr. 8, 2020, in corresponding European Patent Application No. 19187690.3, 15 pages.
Office Action dated Sep. 21, 2020, in corresponding Chinese Application No. 201910671124.5, 11 pages.

* cited by examiner ical Field

Embodiments of the present disclosure relate to an imaging apparatus, and particularly to a heat dissipation structure of the imaging apparatus provided with an image sensor.

Background Art

In imaging apparatuses that photoelectrically convert an image formed by the optical system using an image sensor, there is a need to dissipate heat generated by the image sensor in an appropriate manner. In recent years, miniaturization and high image quality of imaging devices have progressed, and there is a tendency for an imaging device that generates a great amount of heat to be arranged in a compact casing. Accordingly, there is a need to efficiently dissipate heat generated by the image sensor in such a limited space.

SUMMARY

In one aspect of this disclosure, there is provided an imaging apparatus including an exterior component; an image sensor disposed inside the exterior component, the image sensor including a board; a sheet body attached to the image sensor to dissipate heat generated by the image sensors; an elastic body configured to support the sheet body; and a holder configured to hold the elastic body. The sheet body includes a heat receiver attached to the board of the image sensor; and a heat dissipating section attached to the elastic body. The elastic body is compressively deformable between the exterior component and the holder to compress the heat dissipating section against an inner surface of the exterior component.

In another aspect of this disclosure, there is provided an improved imaging apparatus including an exterior component; an image sensor, the image sensor including a board disposed inside the exterior component; and a sheet body attached to the image sensor. The sheet body is configured to dissipate heat generated by the image sensors. The imaging apparatus further includes a holder configured to hold the sheet body, and an elastic body being elastically deformable and having thermal conductivity. The sheet body includes a heat receiver attached to the board of the image sensor, and a heat dissipating section attached to the elastic body. The elastic body is held by the holder and being compressively deformable to be compressed against an inner surface of the exterior component.

BRIEF DESCRIPTION OF THE DRAWINGS

The aforementioned and other aspects, features, and advantages of the present disclosure will be better understood by reference to the following detailed description when considered in connection with the accompanying drawings, wherein.

Figure 1A:
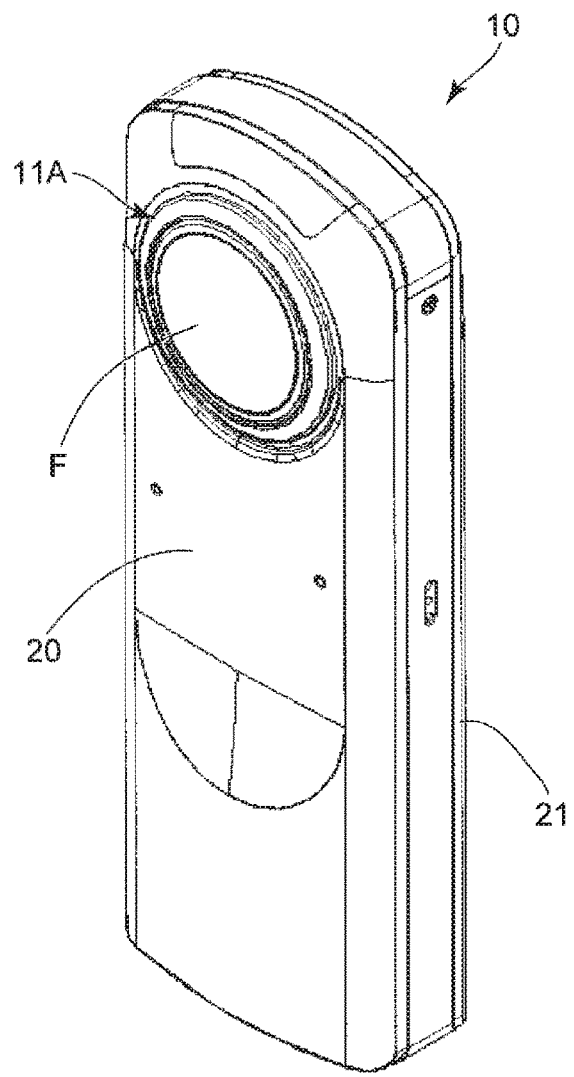
FIG. 1A is a front perspective view of the appearance of an imaging apparatus according to an embodiment of the present disclosure.
Figure 1A:
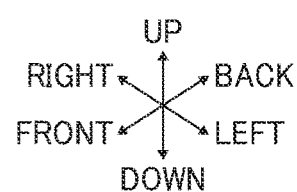

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

Embodiments of the present disclosure are described in detail with reference to the drawings. Like reference numerals designate identical or corresponding components throughout the several views and a description of same is omitted.

An imaging apparatus according to embodiments of the present disclosure is described with reference to the drawings. Each of front-to-back direction, right-to-left direction, and up-to-down direction is indicated by arrows in the drawings.

Figure 3:
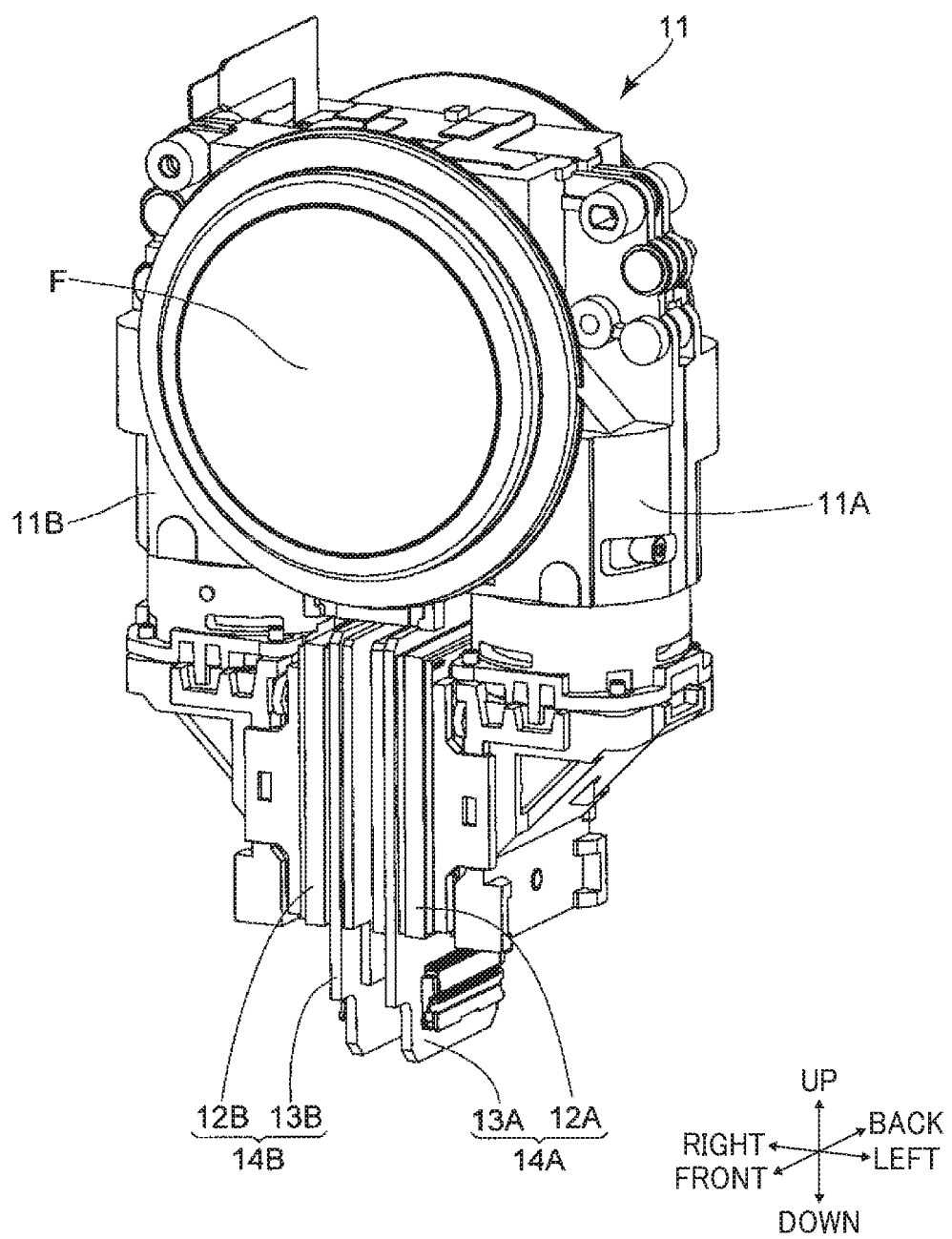
FIG. 3 is a perspective view of an optical unit mounted on the imaging apparatus.

An imaging apparatus 10 according to an embodiment of the present disclosure includes an optical unit 11 (see FIG. 3) formed by symmetrically combining two lens barrels 11A and 11B having the same shape. Each of the lens barrel 11A and 11B includes an imaging optical system that ranges from a front group F on the object side to an imaging plane IP of image sensors 12A and 12B. In the imaging optical system, light from an object is led to and formed on the imaging plane IP of the corresponding image sensor 12A/12B. The barrels 11A and the barrels 11B are combined such that the front groups F of the respective lens barrels 11A and 11B face in opposite directions from each other, and the optical axes of the front groups F are coaxially aligned. The image sensor 12A of the lens barrel 11A is disposed with the imaging plane IP facing the left, and the image sensor 12B of the lens barrel 11B is disposed with the imaging plane IP facing the right.

Figure 4A:
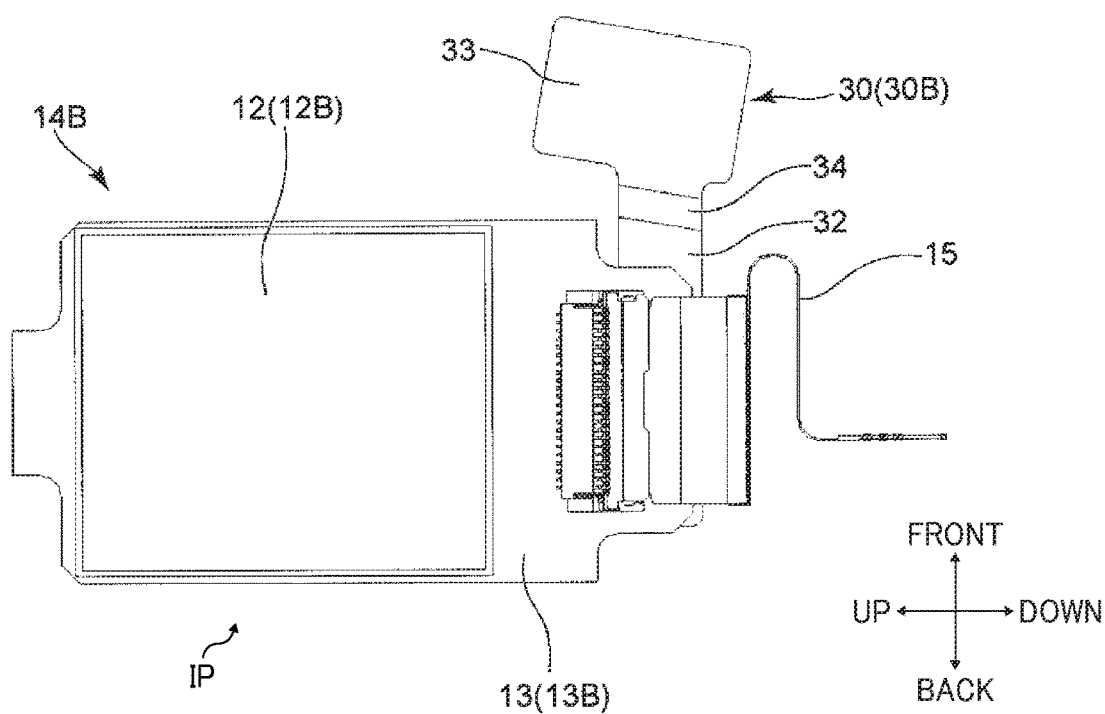
FIG. 4A is an illustration of an image sensor unit provided with the optical unit in FIG. 3, as viewed from an imaging-plane side of the image sensor unit.
Figure 4B:
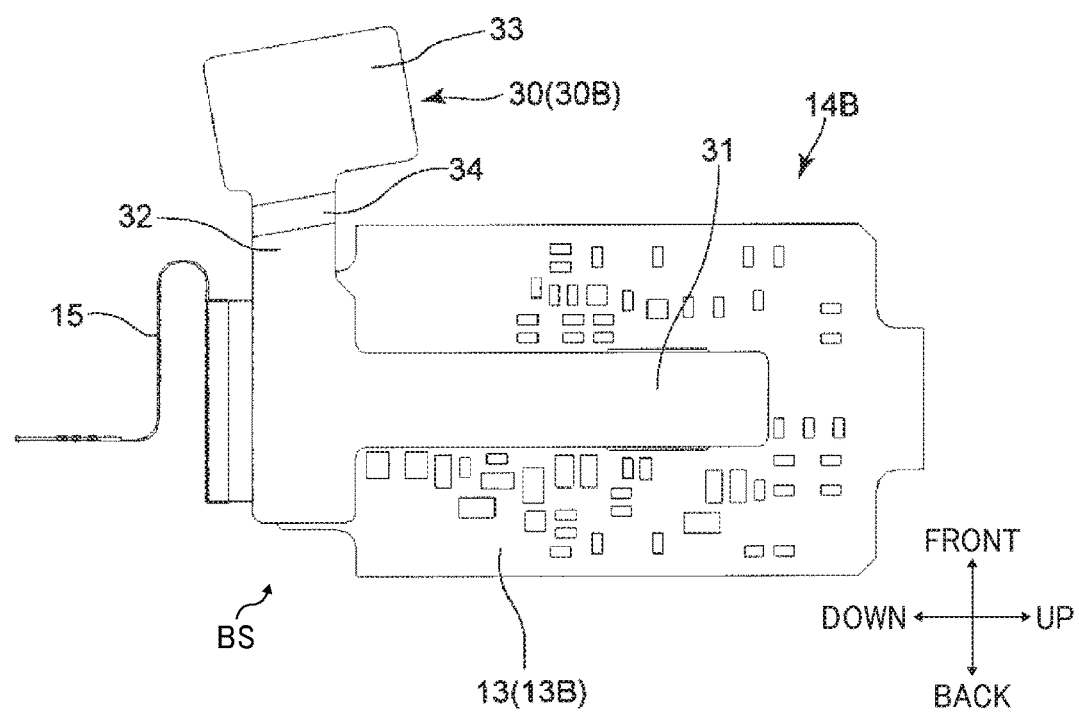
FIG. 4B is an illustration of the image sensor unit as viewed from a board surface on the opposite side of the imaging plane.

The image sensors 12A and 12B are supported by image-sensor boards 13A and 13B, respectively. The image sensor 12A and the image-sensor board 13A are combined to form an image-sensor unit 14A. The image sensor 12B and the image-sensor board 13B are combined to form an image-sensor unit 14B. FIGS. 4A and 4B indicate the image-sensor unit 14B. The image-sensor unit 14A and the image-sensor unit 14B constitute a symmetrical configuration along the right-to-left direction. A flexible board 15 is connected to a connector disposed in the vicinity of the lower ends of the image-sensor boards 13A and 13B.

The lens barrels 11A and 11B are disposed such that the board surfaces (BS) (surfaces on the opposite side of the imaging planes IP of the image sensors 12A and 12B) of the image-sensor boards 13A and 13B face each other. That is, the image-sensor units 14A and 14B are disposed to face in the opposite directions. An object image (an image of an object) formed by each of the imaging optical systems of the lens barrels 11A and 11B is formed on the imaging plane IP of each of the image sensors 12A and 12B, and photoelectrically converted into an image signal. The image signals are then transmitted from the image-sensor boards 13A and 13B to a first board 60 (see FIGS. 20, 23, and 25) disposed within the imaging apparatus 10 through the flexible board 15.

The imaging optical system of each of the lens barrels 11A and 11B has an angle of view wider than 180 degrees, and is an all-round (circumferential) fisheye lens whose image circle fits within the imaging plane IP of each of the image sensors 12A and 12B. The optical unit 1 is configured as a spherical imaging system to generate an image with a solid angle of $4\pi$ steradian by combining two images formed by the image sensors 12A and 12B of the lens barrels 11A and 11B.

The imaging optical system of each of the lens barrels 11A and 11B is configured to be thin in the front-to-back direction by bending the optical path multiple times using a plurality of prisms. The lens barrels 11A and 11B are disposed such that the image-sensor units 14A and 14B face in the opposite directions along the right-to-left direction, and such that the shorter side of each imaging plane IP is along the front-to-back direction, and the longer side longer than the shorter side of each imaging plane IP of the image sensors 12A and 12B is along the up-to-down direction. With such an arrangement, the optical unit 11 as a whole including the two lens barrels 11A and 11B can be made thinner along the front-to-back direction. Accordingly, the parallax between the lens barrels 11A and 11B can be reduced, and higher-quality spherical images can be obtained.

Figure 1B:
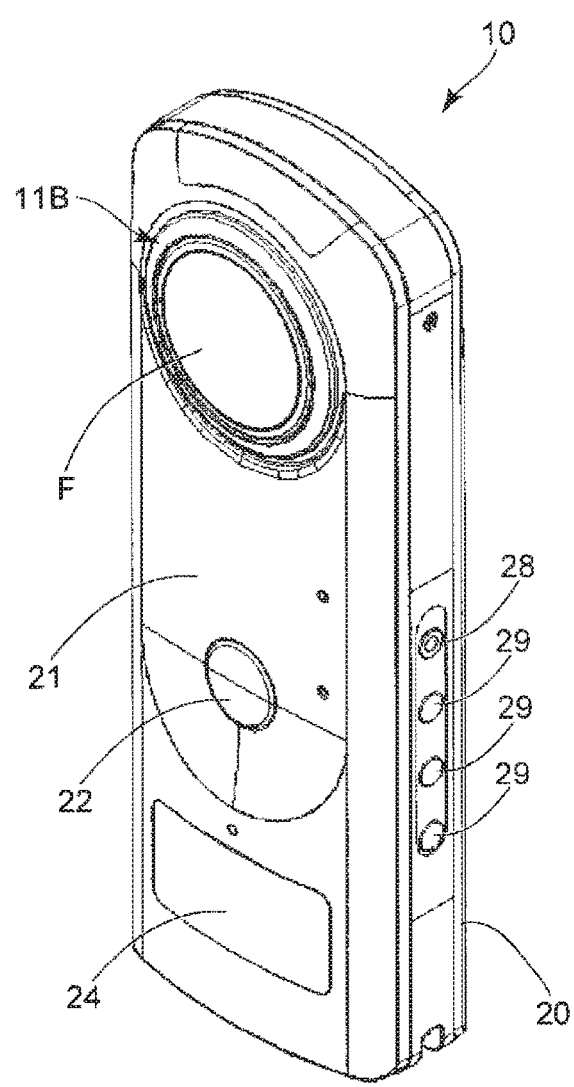
FIG. 1B is a rear perspective view of the appearance of the imaging apparatus according to the embodiment of the present disclosure.
Figure 1B:
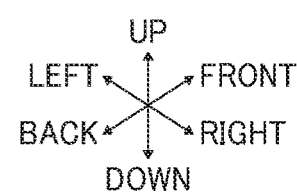

The imaging apparatus 10 includes a front cover 20 and a rear cover 21 as exterior components constituting the outer surface of the imaging apparatus 10. The front cover 20 and the rear cover 21 are both made of metal, such as magnesium and aluminum. As illustrated in FIGS. 1A and 1B, the front cover 20 and the rear cover 21 have a substantially symmetrical shape along the front-to-back direction.

As illustrated in FIG. 11B, the imaging apparatus 10 includes a shutter button 22 slightly below the intermediate portion of the rear face along the up-to-down direction. The imaging apparatus 10 has an opening in the rear cover 21 to enable the shutter button 22 to be exposed to the outside of the imaging apparatus 10. The shutter button 22 is an operation member serving as a trigger for imaging (including both still image capturing and moving image capturing). The imaging apparatus 10 further includes a display unit 24 below the shutter button 22, configured to display several pieces of information for, for example, an operation screen and a setting screen. The display unit 24 can be configured of, for example, an organic EL display. The imaging apparatus 10 further includes a power button 28 at the intermediate portion of the right face along the up-to-down direction. The power button 28 serves as an operation member for switching on and off the imaging apparatus 10. The imaging apparatus 10 further includes a plurality of operation buttons 29 below the power button 28, to operate setting the image-capturing mode or the wireless connection mode. The imaging apparatus 10 is communicable with external devices, such as a personal computer (PC), through the external connector 16 provided at the lower end of the imaging apparatus 10.

Figure 2:
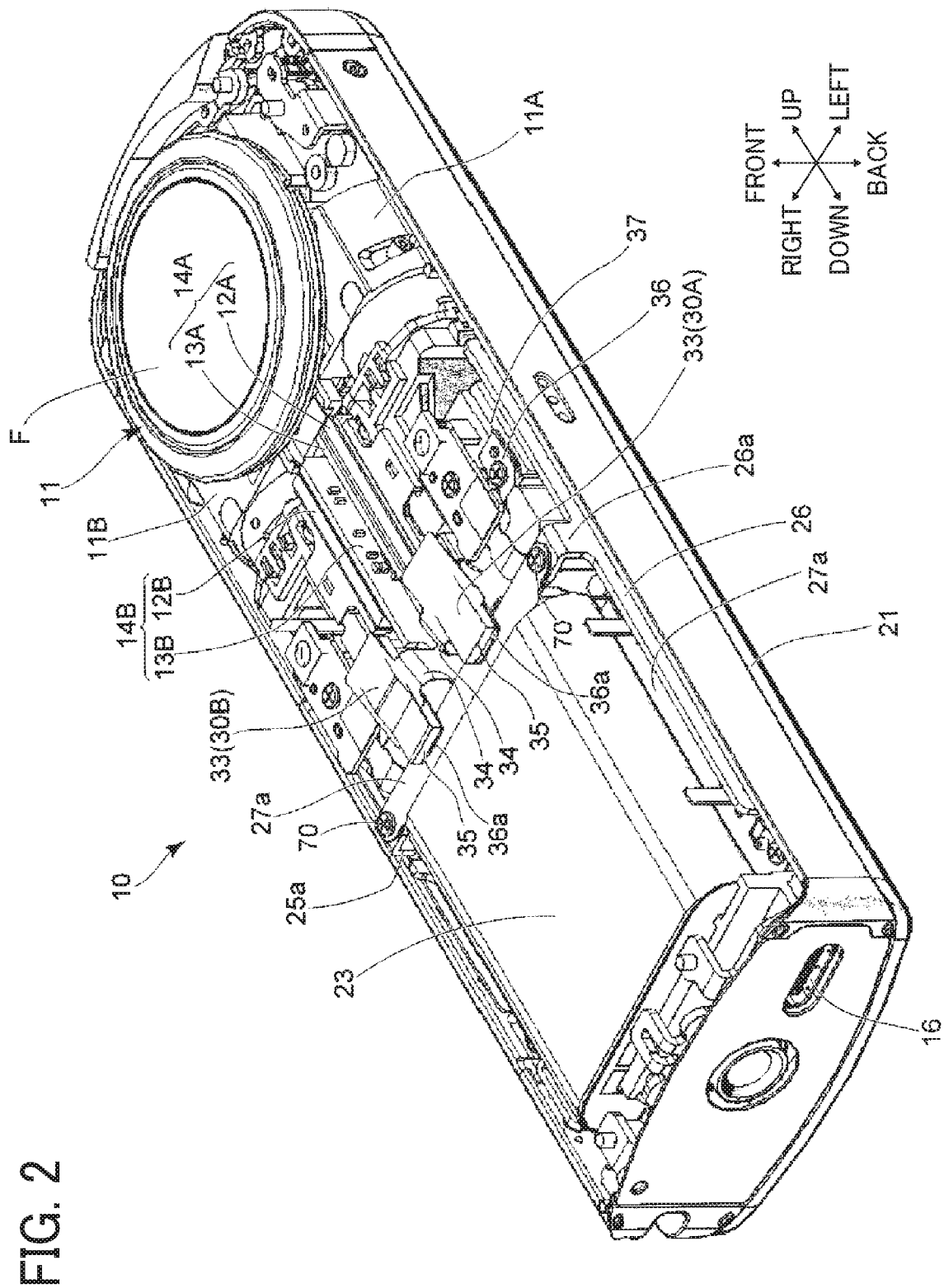
FIG. 2 is a perspective view of the imaging apparatus with a front cover removed.

The imaging apparatus 10 is long in the up-to-down direction, and has two sections arranged along the up-and-down direction within the imaging apparatus 10 as illustrated in FIG. 2. The upper section houses the optical unit 11. The lower section houses a battery 23, a first board 60 and a second board 61 (see FIGS. 20 and 23) for control. In assembling the imaging apparatus 10, built-in components, such as the optical unit 11 and the battery 23, are attached to the rear-cover 21 side (see FIG. 2), and the front cover 20 is attached (screwed) to the rear cover 21 with a screw. Each of the front cover 20 and the rear cover 21 includes a contact configured to determine the relative positions of the front cover 20 and the rear cover 21 along the front-to-back direction.

Figure 5:
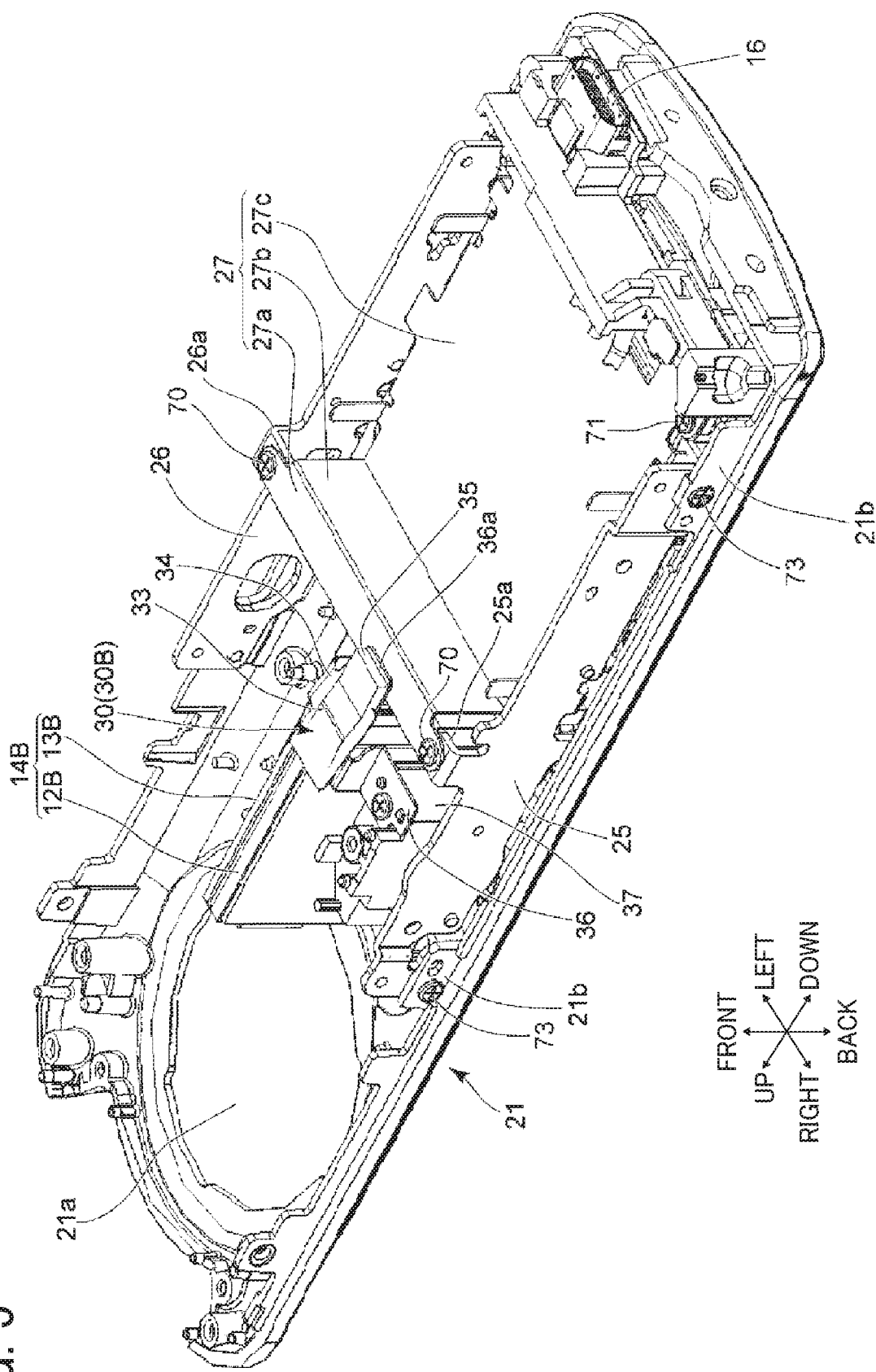
FIG. 5 is a perspective view of an inner surface of the front cover of the imaging apparatus.
Figure 6:
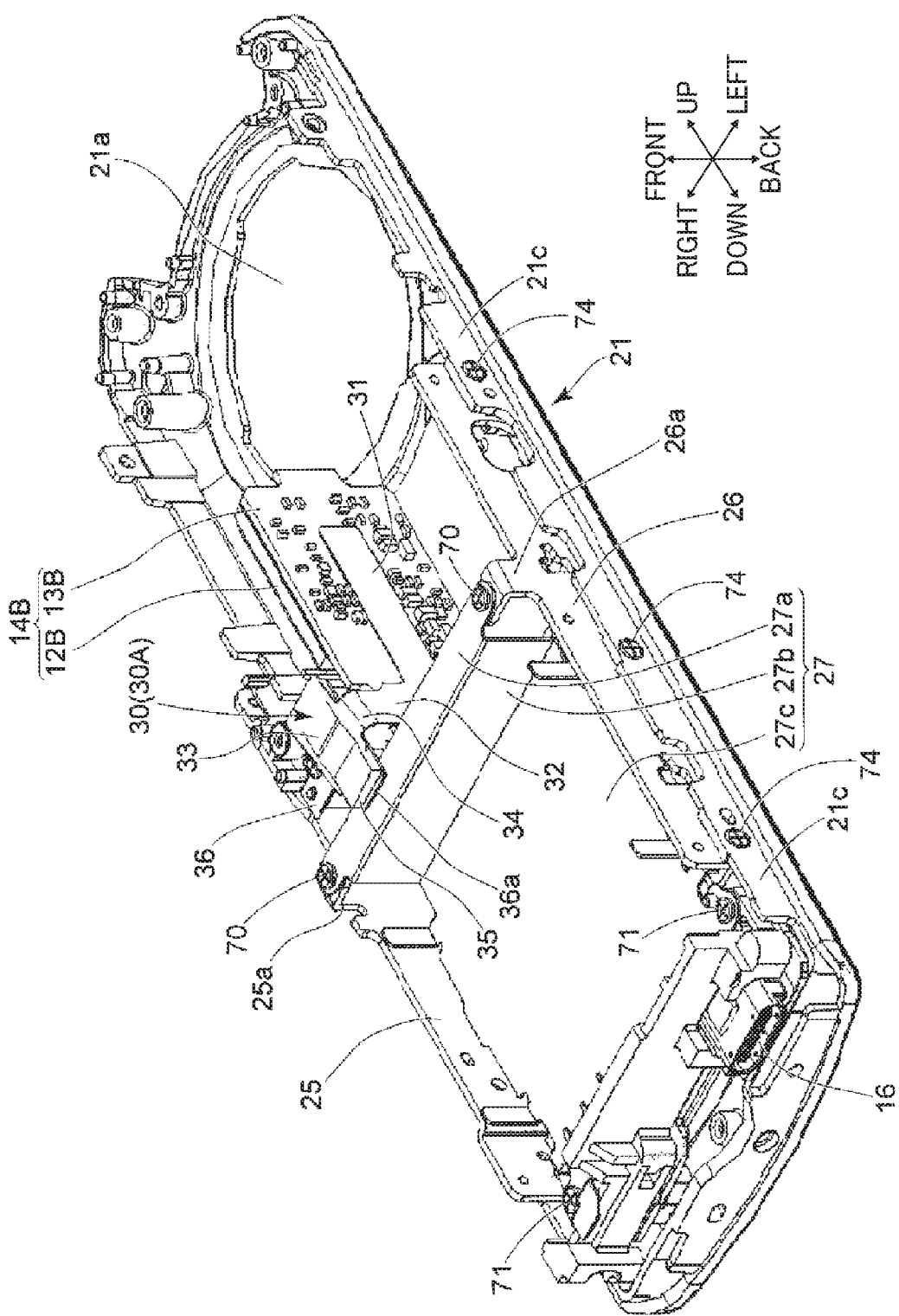
FIG. 6 is a perspective view of an inner surface of a rear cover of the imaging apparatus.
Figure 8:
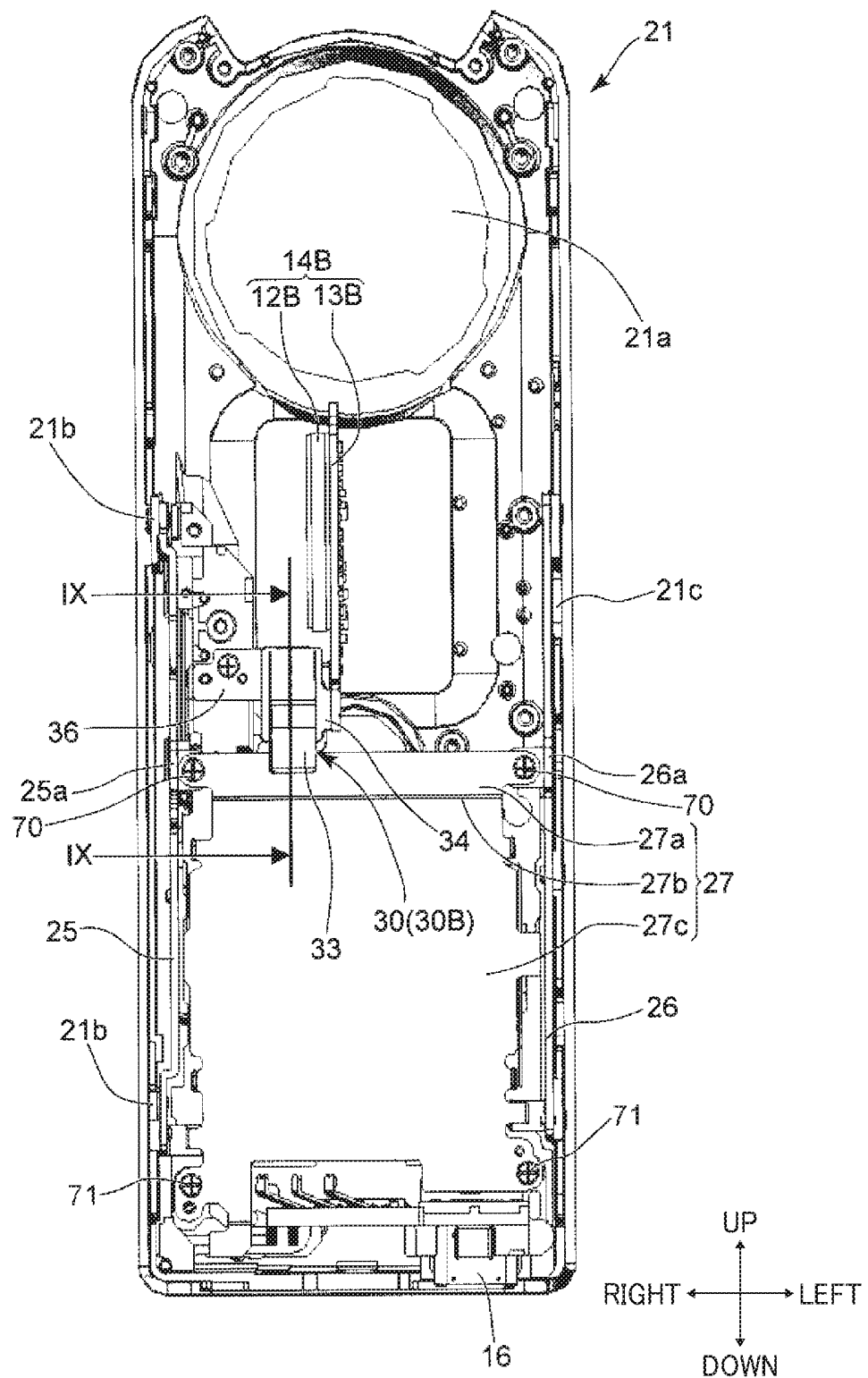
FIG. 8 is a front view of the inner surface side of a rear cover of the imaging apparatus in FIGS. 1A and 1B.

The structure of the inner surface of the rear cover 21 is illustrated in FIGS. 5, 6, and 8. The rear cover 21 has a shape of a plate elongated in the up-to-down direction, and has a lens opening 21a to enable the front group F of the lens barrel 11B to be exposed to the outside of the imaging apparatus 10. On the inner surface of the rear cover 21, a metal frame formed of a side plates 25 and 26, and a transverse plate 27 is disposed. The side plates 25 and 26 and the transverse plate 27 are all made of metal, and are attached to the rear cover 21 and the front cover 20. This configuration enhances the rigidity of the imaging apparatus 10.

The side plate 25 extends along the up-to-down direction at the right edge of the rear cover 21, and is screwed to the rear cover 21 with a plurality of screws at different positions along the up-to-down direction. More specifically, as illustrated in FIG. 5, plate-shaped fastening sections 21b projecting forward are disposed close to (near) the right edge of the rear cover 21. The side plate 25 is screwed to the fastening sections 21b with a plurality of screws 73 at different positions. Specifically, the upper end and the lower end of the side plate 25 are screwed to the fastening sections 21b.

The side plate 26 extends along the up-to-down direction at the left edge of the rear cover 21, and is screwed to the rear cover 21 with a plurality of screws at different positions along the up-to-down direction. More specifically, as illustrated in FIG. 6, plate-shaped fastening sections 21c projecting forward are disposed close to (near) the right edge of the rear cover 21. The side plate 26 is screwed to the fastening sections 21c with a plurality of screws 74 at different positions. Specifically, the upper end and the lower end of the side plate 26 are screwed to the fastening sections 21c.

The side plates 25 and 26 are also screwed to the front cover 20 after the front cover 20 is attached to the rear cover 21. With this configuration, the side plates 25 and 26 are attached to (screwed to) the rear cover 21 and the front cover 20, which allows for heat transfer between the metals in contact with each other.

The side plate 25 and the side plate 26 are provided with fastening sections 25a and 26a located midway along the up-to-down direction (the longitudinal direction of the side plates 25 and the side plate 26), respectively. The fastening section 25a has a shape that projects upward (to the front indicated by arrow in FIG. 5) from the body of the side plate 25 and bends to the left. The fastening section 26a has a shape that projects upward (to the front indicated by arrow in FIG. 6) from the body of the side plate 26 and bends to the right. The bending portions of the fastening sections 25a and 26a are attached to the right-to-left directional ends of the transverse plate 27 using the screws 70.

The transverse plate 27 extends right-to-left direction to connect the side plate 25 and the side plate 26. A front plate 27a of the transverse plate 27 is attached to the fastening sections 25a and 26a with the screws 70. The front and back faces of the front plate 27a face in the front-to-back direction of the imaging apparatus 10. A dividing plate 27b of the transverse plate 27 extends rearward from the lower edge of the front plate 27a, and the front and back faces of the dividing plate 27b face up-to-down direction of the imaging apparatus 10. The dividing plate 27b divides the interior space of the imaging apparatus 10 into two sections in the up-to-down direction. The transverse plate 27 further includes a bottom plate 27c that extends downward from the rear edge of the dividing plate 27b. The front and back faces of the bottom plate 27c face in the front-to-back direction, and the battery 23 is disposed on the front side of the bottom plate 27c (see FIG. 2).

In the casing of the imaging apparatus 10, the image-sensor units 14A and 14B including large image sensors 12A and 12B are arranged close to each other, facing in the opposite directions. The casing is thin in the front-to-back direction. Under such conditions, a heat-dissipation structure is provided to efficiently dissipate the heat generated from the image sensors 12A and 12B. Hereinafter, the heat-dissipation structure in the imaging apparatus 10 is described.

The heat-dissipation structure of the imaging apparatus 10 enables heat generated from the image-sensor units 14A and 14B to be dissipated to the front cover 20 and the rear cover 21, which are the exterior components, using a heat dissipation sheet 30 a heat dissipator. As the heat dissipation sheet 30, a heat dissipation sheet 30A is provided for the image-sensor unit 14A, and a heat dissipation sheet 30B is provided for the image-sensor unit 14B. The heat dissipation sheet 30A and the heat dissipation sheet 30B have the same structure except for, for example, a bending direction. In the following description, the heat dissipation sheet 30A and the heat dissipation sheet 30B are individually referred to as to describe the differences between the heat dissipation sheet 30A and the heat dissipation sheet 30B but are referred to collectively as the heat dissipation sheet 30 to describe the common features. The same applies to the image sensors 12A and 12B, and the image-sensor boards 13A and 13B.

The heat dissipation sheet 30 (sheet body) is a flexible sheet made of material advantageous in heat conductivity. For example, the heat dissipation sheet 30 is preferably made of graphite. As illustrated in FIGS. 4A and 4B, the heat dissipation sheet 30 includes a heat receiver 31 attached to the back of the image-sensor board 13, an interposer 32 that extends from the heat receiver 31, and a heat dissipating section 33 disposed at the end of the interposer 32. An adhesive layer is formed on one side of the heat dissipation sheet 30. The adhesive layer is formed on the side surface of the heat dissipation sheet 30 illustrated in FIG. 4A, and not formed on the side surface of the heat dissipation sheet 30 illustrated in FIG. 4B. In the heat dissipation sheet 30, the front face is a non-adhesive-layer side at which the adhesive layer is not formed, and the back face is an adhesive-layer side at which the adhesive layer is formed.

As illustrated in FIGS. 4A and 4B, the heat receiver 31 has a stripe shape that is elongated up-to-down direction. The back face of the heat receiver 31, i.e., the adhesive layer, is attached to the back face of the image-sensor board 13 such that the heat receiver 31 is positioned near the center of the back face of the image-sensor board 13 in the front-to-back direction while extending along the up-to-down direction. The interposer 32 has a strip shape elongated in the front-to-back direction. The lower edge of the heat receiver 31 is connected to the interposer 32 at a position near the center of the interposer 32 in the longitudinal direction (the front-to-back direction). The interposer 32 also has the adhesive layer on the back face attached to the back face of the image-sensor board 13. The heat dissipating section 33 extends from the front edge of the interposer 32. The interposer 32 is connected to the heat dissipating section 33 at a position near the lower end of the heat dissipating section 33. A bending section 34 is provided between the interposer 32 and the heat dissipating section 33. In the initial state of the heat dissipation sheet 30, the bending section 34 is not bent, and the heat dissipating section 33 has a shape that significantly projects forward beyond the image sensor 12 and the image-sensor board 13 (see FIGS. 4A and 4B). When the bending section 34 is bent, the front and back faces of the heat dissipating section 33 face in the front-to-back direction.

The heat dissipation sheet 30A connected to the image-sensor unit 14A and the heat dissipation sheet 30B connected to the image-sensor unit 14B are bent in opposite directions. Specifically, the bending section 34 of the heat dissipation sheet 30A connected to the image-sensor board 13A is configured to bend to the left (the image-sensor 12A side). The bending section 34 of the heat dissipation sheet 30B connected to the image-sensor board 13B is configured to bend to the right (the image-sensor 12B side). With this configuration, the heat dissipating section 33A and the heat dissipating section 33B are arranged in parallel with each other along right-to-left direction. In other words, the heat dissipation sheet 30A and the heat dissipation sheet 30B are symmetrically disposed along right-to-left direction when the bending sections 34 are bent. Bending of the bending sections 34 orients the front face and the back face of the heat dissipating section 33 of each of the heat dissipation sheets 30A and 30B to the front and the back, respectively.

As illustrated in FIGS. 4A and 4B, the bending line of the bending section 34 extends in the up-to-down direction while tilting in the front-to-back direction. This configuration provides a tilted shape (see FIG. 7) in which the amount of projection of the heat dissipating section 33 changes in the front-to-back direction, according to the position along the up-to-down direction when the bending section 34 is bent. Specifically, the distal end (the upper end) of the heat dissipating section 33 projects to the front further than the proximal end (lower end) of the heat dissipating section 33 connected to the interposer 32 does.

The adhesive layer on the back of the heat dissipating section 33 is attached to the front face of an elastic member 35 (elastic body). The elastic member 35 is elastically deformable, and is made of material advantageous in heat resistance. The elastic member 35 is supported by a base 36. The base 36 is a metal plate, and is screwed to a support 37 on the rear cover 21. The elastic member 35, the base 36, and the support 37 of the heat dissipation sheet 30A on the left is symmetrical with the elastic member 35, the base 36, and the support 37 of the heat dissipation sheet 30B on the right along the right-to-left direction.

The base 36, which serves to support the heat dissipating section 33 on the heat-dissipation-sheet 30B side, projects upward (to the front as indicated by arrow in FIGS. 5 to 7) from the location at which the base is screwed to the support 37, and turns (bends) to the left. The bent base 36 has a support plate 36a positioned on the back of the elastic member 35 (see FIGS. 5 to 7). The base 36, which serves to support the heat dissipating section 33 on the heat-dissipation-sheet 30B side, projects upward (to the front as indicated by arrow in FIG. 2) from the location at which the base is screwed to the support 37, and turns (bends) to the right. The bent base 36 has a support plate 36a positioned on the back of the elastic member 35 (see FIG. 2). An adhesive layer is provided on the rear face of the elastic member 35 (the face opposite to the face to which the heat dissipating section 33 is attached). The elastic member 35 is attached to the front face of the support plate 36a via the adhesive layer. The lower end of the support plate 36a is superimposed on the front plate 27a of the transverse plate 27 in the front-to-back direction, and is support by the transverse plate 27 from the back side (see FIGS. 7 and 9). Accordingly, each of the left and right bases 36 is supported by the corresponding support 37 and transverse plate 27.

Figure 9:
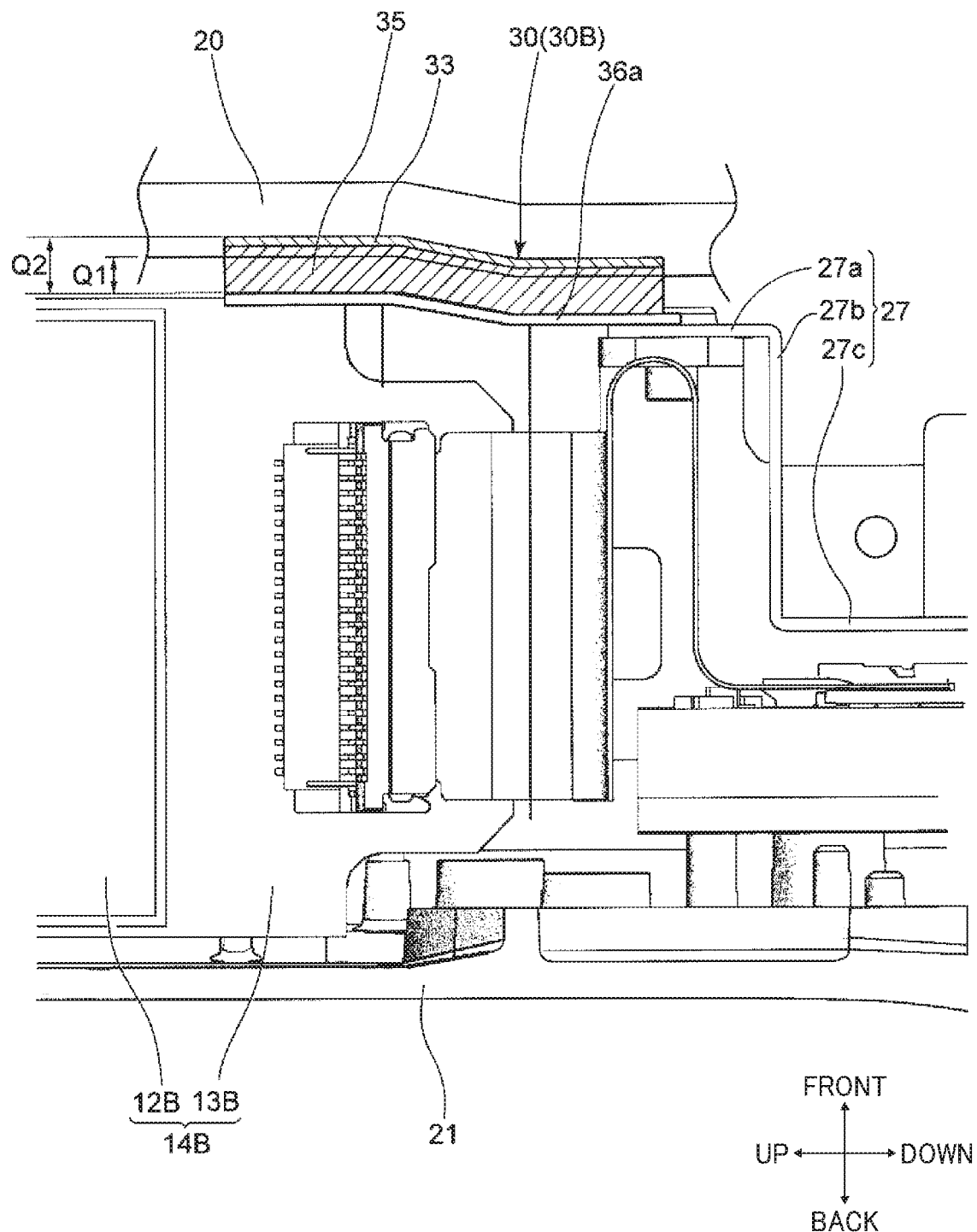
FIG. 9 is a cross-sectional view taken along the line IX-IX in FIG. 8.

FIG. 9 is an illustration of the cross-sectional structure in which the heat dissipating section 33, the elastic member 35, and the support plate 36a of the base 36 are disposed on top of each other. Each of the elastic member 35 and the support plate 36a has a tilted shape that corresponds to the above-described tilted shape of the heat dissipating section 33. In the tilted shape of each of the elastic member 35 and the support plate 36a, the amount of forward projection on the upper-end side than the lower-end side does.

As described above, the front cover 20 is attached to the rear cover 21 from the front side with the heat dissipation sheets 30A and 30B, which are connected with the image-sensor units 14A and 14B, supported by the elastic member 35 and the support plate 36a. In FIG. 9, the partially illustrated front cover 20 is attached to the rear cover 21. Further, the elastic member 35 in FIG. 9 is not compressively deformed, that is, the elastic member 35 is at the first state. When Q1 denotes the distance between the support plate 36a and the inner surface of the front cover 20 and Q2 denotes the distance between the support plate 36a and the front face of the heat dissipating section 33 (the sum of the thicknesses of the elastic member 35 and the heat dissipating section 33), the relation that Q1 is smaller than Q2 (Q1 Q2) is satisfied. That is, the heat dissipating section 33 at the first state projects forward (to the front as indicated by arrow in FIG. 9) beyond the inner surface of the front cover 20 attached to the rear cover 21.

The heat dissipating section 33, the elastic member 35, and the support plate 36a are disposed on top of each other in the same direction as the direction (the front-to-back direction) in which the front cover 20 is attached to the rear cover 21. In such a configuration, when the front cover 20 is attached to the rear cover 21, the inner surface of the front cover 20 contacts the front face of the heat dissipating section 33 to press the heat dissipating section 33 backward (to the back as indicated by arrow in FIG. 9) while compressing and deforming the elastic member 35. The compressed and deformed elastic member 35 provides a force to the heat dissipating section 33 due to the restoring action of the elastic member 35 so that the front surface of the heat dissipating section 33 is pressed against the inner surface of the front cover 20. As a result, the front surface of the heat dissipating section 33 comes into pressure (close) contact with the inner surface of the front cover 20. While the front cover 20 and the rear cover 21 are attached to each other, this pressure contact (compression) state is maintained, and the heat is effectively transferred from the heat dissipation sheet 30 to the front cover 20. This configuration enables the heat generated by the image sensor 12 to be dissipated to the exterior component, such as the front cover 20 made of metal, over a wide area using the heat dissipation sheet 30.

The heat dissipating section 33 and the elastic member 35 are supported by the base 36 made of metal from the back side. The base 36 is supported by both the support 37 and the transverse plate 27, which provides an advantageous support strength. This configuration prevents the elastic member 35 from being deformed by a pressing three from the front cover 20 side. Accordingly, the heat dissipating section 33 can be kept compressed against the front cover 20. In other words, the heat dissipating section 33 can be prevented from being separated from the front cover 20.

As described above, the imaging apparatus 10 according to an embodiment of the present disclosure enables the heat generated by the image sensors 12A and 12B to be dissipated to the front cover 20 made of metal through the heat dissipation sheets 30A and 30B, which means that the heat generated by the image sensors 12A and 12B disposed close to each other in a small space within the casing can be effectively dissipated. Further, according to an embodiment of the present disclosure, the heat dissipation sheets 30A and 30B that correspond to the image sensors 12A and 12B are disposed such that the front faces of the heat dissipating sections 33 face in the same direction (the front as indicated by arrow in the figures). With this arrangement, the front cover 20 is a shared target, to which heat is transferred, between the heat dissipation sheets 30A and 30B. Accordingly, complication of the heat-dissipation structure can be prevented.

The heat receiver 31 of each of the heat dissipation sheets 30A and 30B is connected to the board surface (surface on the opposite side of the imaging plane IP of each of the image-sensor boards 13A and 13B). The board surface of the image-sensor unit 14A is opposed to the board surface of the image-sensor unit 14B. Such a configuration facilitates the heat dissipation sheet 30's dissipation of the heat between the image-sensor unit 14A and the image-sensor unit 14B, which can reduce the influence of heat between the image sensors 12A and 12B.

The heat dissipating section 33 of each of the heat dissipation sheets 30A and 30B is not attached to the front cover 20, for example, by adhesive. Instead, the heat dissipating section 33 is brought into pressure (close) contact with the front cover 20 using the compressive deformation of the elastic member 35 in the direction in which the heat dissipating section 33 and the elastic member 35 are disposed when the front cover 20 is attached to the rear cover 21. This configuration eliminates a need for a certain operation to connect the heat dissipating section 33 to the front cover 20 in attaching the front cover 20 to the rear cover 21. When the front cover 20 is removed from the completely assembled imaging apparatus 10 in FIGS. 1A and 1B, the heat dissipating section 33 is merely separated from the front cover 20, and the heat dissipation sheets 30A and 30B remain on the rear cover 21 side without being damaged. In this configuration, there is no need to replace the heat dissipation sheet 30 with new one in removing the front cover 20. By attaching the front cover 20 to the rear cover 21 again, the above-described heat-dissipation structure that provides an advantageous heat-dissipation efficiency can be obtained.

In the imaging apparatus according to a comparative example, one end of the heat dissipation sheet 24 is attached to the rigid 201 of the sensor board 20, and the other end of the heat dissipation sheet 24 is attached to the back face of the front cover 40. Each attachment provides a thermal connection. However, it is difficult to properly bring the other end of the heat dissipation sheet 24 into close contact with the back face of the front cover 40 at an appropriate position. For example, there is a need for the heat dissipation sheet 24 to have a sufficient length to attach the end of the heat dissipation sheet 24 to the back face of the front cover 40 before attaching the front cover 40 to the camera body. In such a case, an area for accommodating the heat dissipation sheet 24 adversely increases, and a reduction in the size of the imaging apparatus is prevented. If the heat dissipation sheet 24 is shortened, and the end of the heat dissipation sheet 24 is attached to the front cover 40 at the time of attaching the front cover 40 to the camera body, the heat dissipation sheet 24 is not properly attached to the front cover due to the attachment to an improper position and a partial improper attachment. Accordingly, the performance of transferring heat to the front cover 40 might decrease.

In the heat dissipation structure according to the comparative example, when the front cover 40 is removed when repairing or adjusting the imaging apparatus, the heat dissipation sheet 24 attached to the back face of the front cover 40 is damaged. For this reason, the damaged heat dissipation sheet 24 is to be replaced with new one, which increases cost of parts.

When the heat dissipation sheet 24 is replaced, one end of the heat dissipation sheet 24 attached to the rigid 201 side of the sensor board 20 is peeled off before a new heat dissipating sheet 24 is attached. Accordingly, the sensor board 20 and other components around the sensor board 20 are to be removed. If the sensor board 20 is removed, optical adjustment or the like has to be performed in attaching the sensor board 20 to the camera body again, which increases the labor and cost of the operation.

However, the heat-dissipation structure according to an embodiment of the present disclosure can reduce the space to be occupied by the heat dissipation sheets 30A and 30B while enabling the heat dissipating section 33 to be thermally connected to the front cover 20 at a proper position merely by attaching the front cover 20 to the rear cover 21. Moreover, the front cover 20 can be freely attached and detached without damaging the heat dissipation sheets 30A and 30B, and the heat transfer from the heat dissipating section 33 can be reliably obtained when the front cover 20 is attached to the rear cover 21. Further, as there is no need to replace the heat dissipation sheet 30 with new one, the cost of parts can be reduced, and the labor and cost for the operation can also be reduced.

Particularly, in the imaging apparatus 10 according to an embodiment of the present disclosure, the image-sensor units 14A and 14B are disposed close to each other such that the hoard surfaces of the image-sensor boards 13A and 13B are opposed to each other. In such an arrangement, it is difficult to access the locations at which the heat receivers 31 of the heat dissipation sheets 30A and 30B are attached to the image-sensor boards 13A and 13B when the optical units 11 are combined with each other. For this reason, there is a need to remove the optical unit 11 including the image-sensor units 14A and 14B to replace the heat dissipation sheet 30 with new one. Accordingly, an optical adjustment of the lens barrel 11A and the lens barrel 11B is to be performed in reattaching the optical unit 11, which takes a great amount of work. In the heat-heat-dissipation structure according to an embodiment of the present disclosure, there is no need to replace the heat dissipation sheet 30 with new one when attaching and detaching the front cover 20. Thus, an increase in labor and cost can be prevented.

The front cover 20 is attached to the rear cover 21 at the final stage of assembly after the internal structure of the imaging apparatus 10 including the optical unit 11 is held by the rear cover 21 (see FIG. 2). As the heat dissipating section 33 of each of the heat dissipation sheets 30A and 30B is exposed to the outside of the internal structure, the state of the heat dissipating section 33 can be easily checked (bending and deformation states) immediately before attaching the front cover 20. Accordingly, the failure in heat dissipation can be prevented beforehand.

Figure 10:
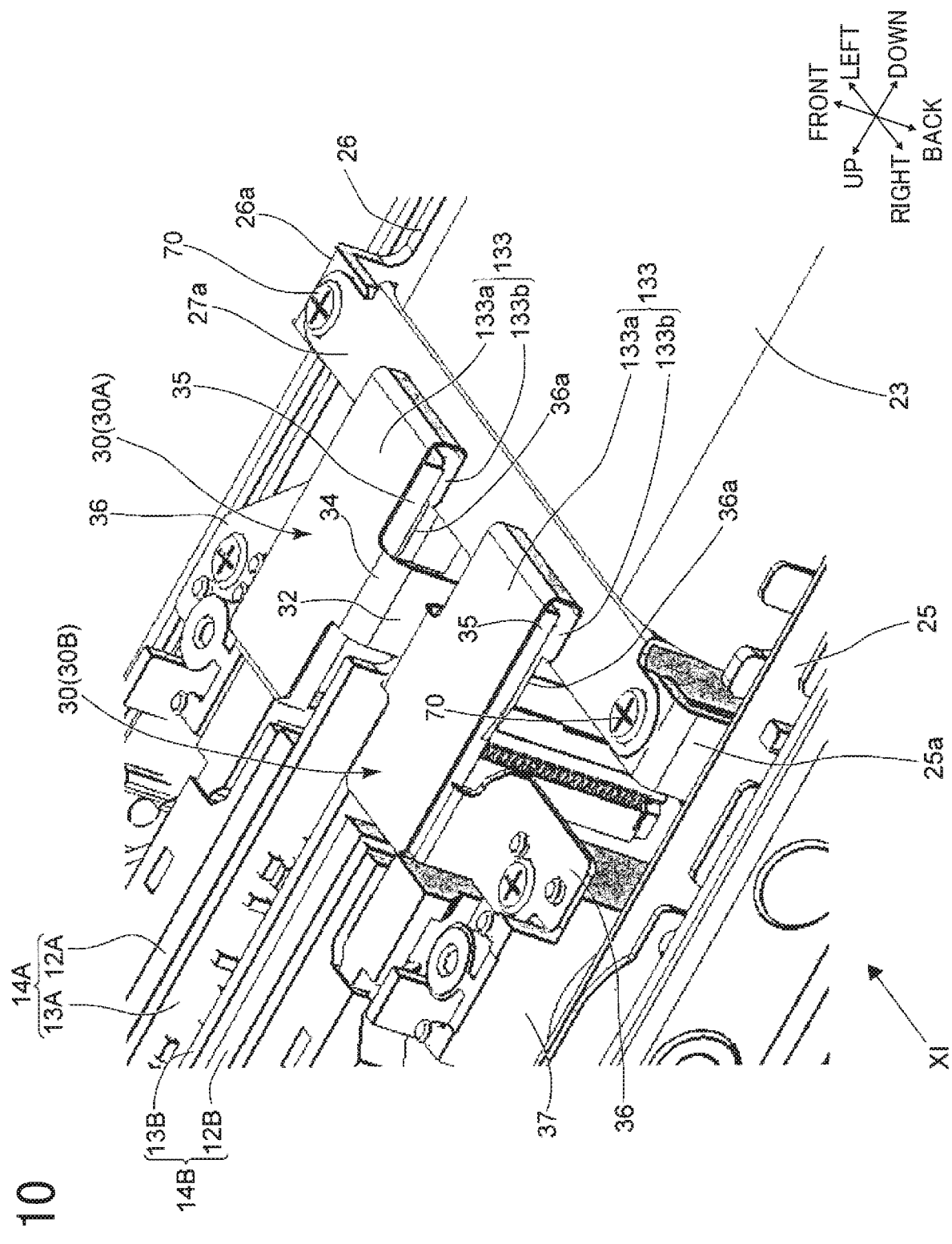
FIG. 10 is a perspective view of a heat-dissipation structure of an imaging apparatus, according to a first modification of an embodiment.
Figure 11:
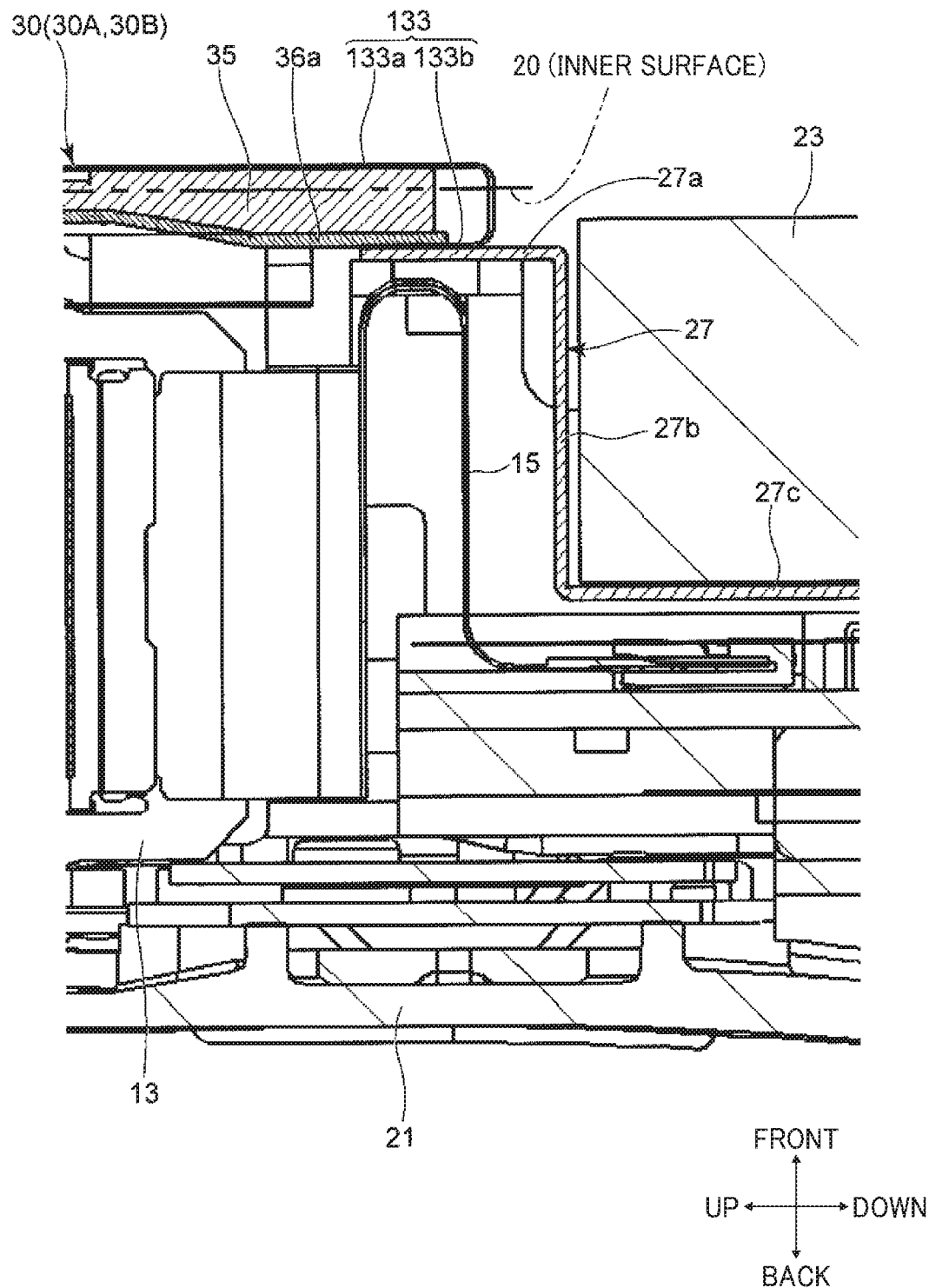
FIG. 11 is a cross-sectional view of an area near the heat dissipation sheet as viewed from a direction of arrow XI in FIG. 10.
Figure 12:
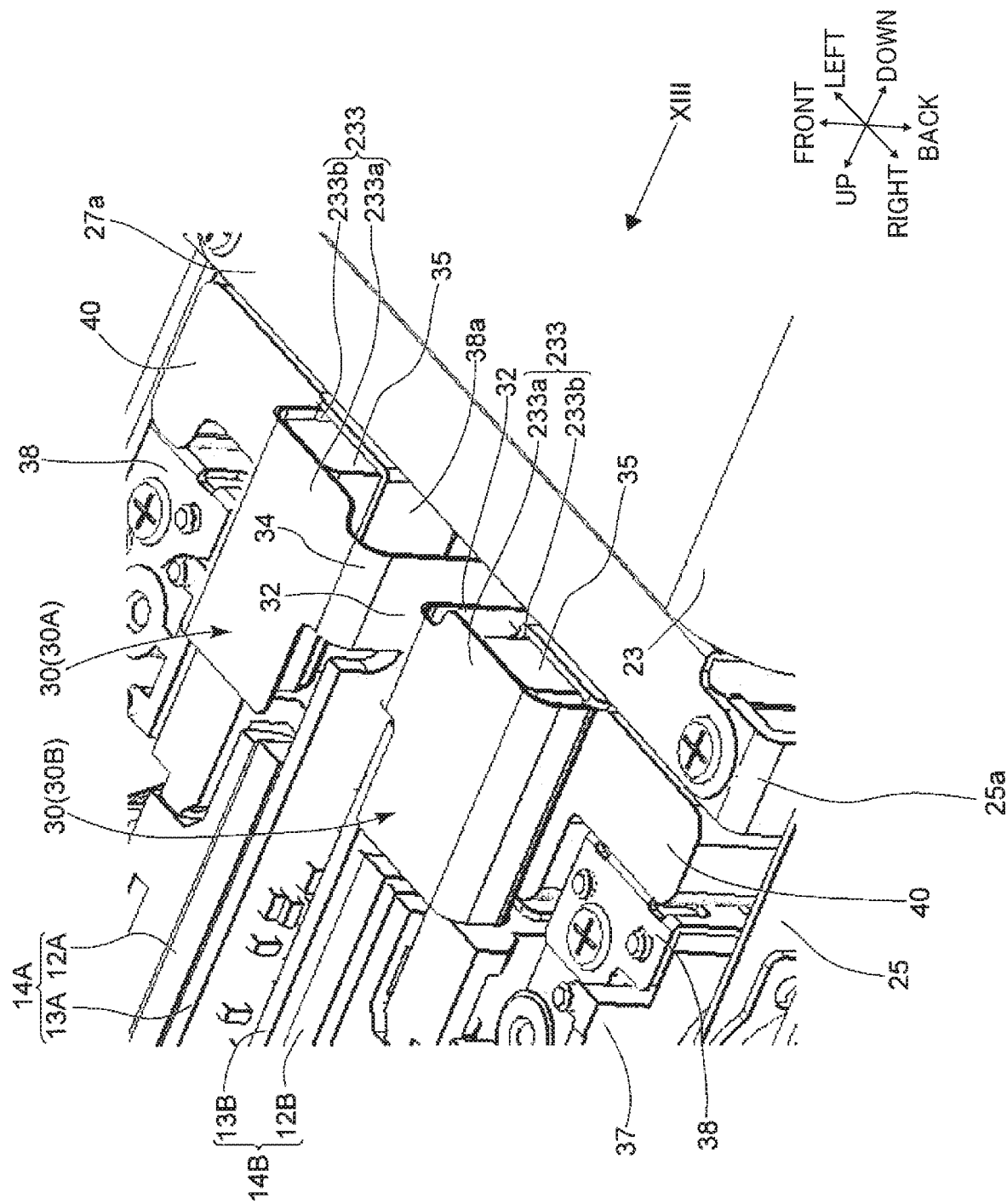
FIG. 12 is a perspective view of a heat-dissipation structure of an imaging apparatus, according to a second modification of an embodiment.

Then, the modifications of the heat dissipation structure in imaging apparatus 10 are described. FIGS. 10 and 11 are illustrations of the heart-dissipation structure according to a first modification. FIGS. 12 to 16 are illustrations of the heat-dissipation structure according to a second modification. FIG. 17 is an illustration of the heat-dissipation structure according to a third modification. In each of the following modifications, the same elements as those of the above-described embodiments are indicated with the same reference numerals, and description thereof is omitted. Moreover, the parts not illustrated in the drawing have the same structure as those of the above-mentioned embodiment.

In FIGS. 10 and 11 according to a first modification of an embodiment, each of the heat dissipation sheets 30A and 30B includes a heat dissipating section 133. The heat dissipating section 133 includes an exterior contact 133a and a frame contact 133b.

The exterior contact 133a corresponds to the above-described heat dissipating section 33. The adhesive layer on the back face is attached to the front face of the elastic member 35, and no adhesive layer is formed on the front face of the exterior contact 133a. The position of the inner surface of the front cover 20, which is attached to the rear cover 21, is indicated by two-dot chain line in FIG. 11. In the initial state of the elastic member 35, that is, the elastic member 35 is not compressively deformed, the exterior contact 133a is in the front of the inner surface of the front cover 20.

In this configuration, when the front cover 20 is attached to the rear cover 21, the exterior contact 133a of each of the heat dissipation sheets 30A and 30B is brought into contact with the inner surface of the front cover 20, which presses the exterior contact 133a backward while compressively deforming the elastic member 35. With the exterior contact 133a in pressure contact with (compressed against) the front cover 20, a heat-transfer path is formed to enable the heat generated by the image sensors 12A and 12B to be dissipated to the front cover 20.

The frame contact 133b is formed by bending the lower end of the exterior contact 133a backward and further folding it upward to form a U shape. The frame contact 133b is disposed between the support plate 36a of the base 36 and the front plate 27a of the transverse plate 27. An adhesive layer is formed on the back face of the frame contact 133b (the back face of the frame contact 133b faces the front because the frame contact 133b is folded upward), extending over the back face of the exterior contact 133a. The adhesive layer of the frame contact 133b is attached to the back face of the support plate 36a. The front face of the frame contact 133b (which faces backward because the frame contact 133b is folded backward) faces the front face of the front plate 27a. An adhesive layer is not formed on the front face of the frame contact 133b, which means that the frame contact 133b is not attached to the front plate 27a. As described above, the front plate 27a is a part to support the lower end of the support plate 36a of the base 36.

When the front cover 20 is attached to the rear cover 21 so that the elastic member 35 is compressively deformed, the support plate 36a at the back of the elastic member 35 is pressed backward. The pressing of the support plate 36a causes the lower end of the support plate 36a to press the frame contact 133b backward so that the frame contact 133b comes into pressure contact with (compressed against) the front plate 27a. This configuration forms another heat-transfer path from the frame contact 133b to the transverse plate 27, in addition to the above-described heat-transfer path from the exterior contact 133a to the front cover 20.

The transverse plate 27 is fastened to the side plates 25 and the side plate 26, and the side plates 25 and the side plate 26 are fastened to the rear cover 21 and the front cover 20. This configuration can dissipate heat to the rear cover 21 and the front cover 20 through the metal frame (the side plates 25, the side plate 26, and the transverse plate 27) within the casing, which can increase the heat dissipation property.

The frame contact 133b is configured to be held between the support plate 36a and the front plate 27a when the front cover 20 is attached to the rear cover 21. With this arrangement, the frame contact 133b can be reliably maintained in contact with the transverse plate 27 to which the heat is to be dissipated same as the exterior contact 133a and the heat dissipating section 33, without attaching the frame contact 133b to the transverse plate 27 by, for example, adhesive. Accordingly, the front cover 20 as well as the transverse plate 27 can be removed without any damage on the heat dissipating section 133, which can reduce the time and cost for replacement of the heat dissipation sheet 30.

In FIGS. 12 to 16 according to a second modification of an embodiment, the casing of the imaging apparatus 10 further includes a heat storage member 40 (heat storage body) to which heat is transferred from the heat dissipation sheets 30A and 30B. The heat storage member 40 is made of material having a high heat storage property (large heat-storage capacity and good heat-absorption efficiency). In the imaging apparatus 10, a pair of right and left heat storage members 40 is disposed at positions adjacent to and below the positions of the left and right supports 37, respectively. A pair of right and left bases 38 is screwed to the right and left supports 37.

Figure 16:
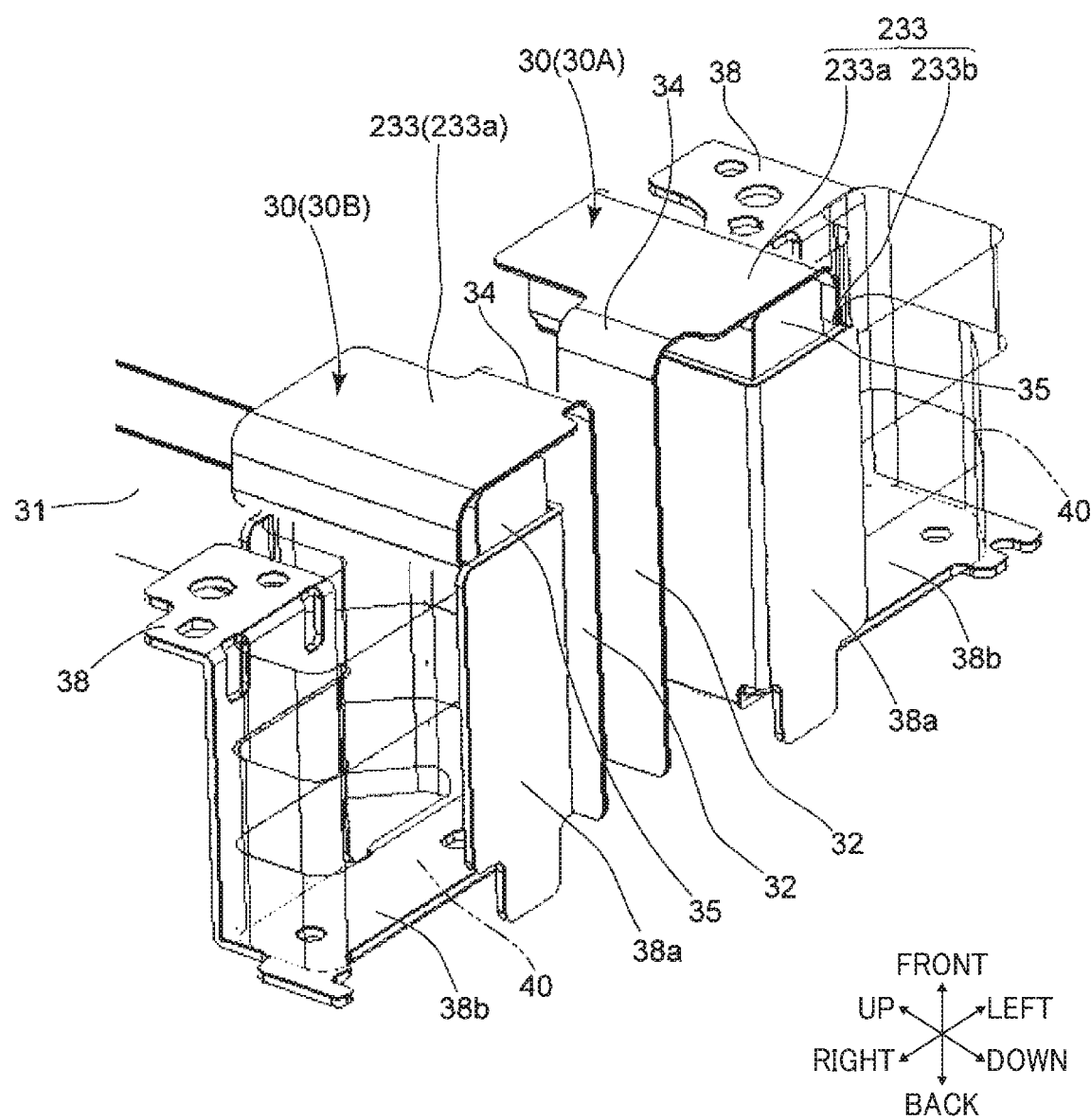
FIG. 16 is a perspective view of a part of the heat-dissipation structure in FIG. 15.
Figure 17:
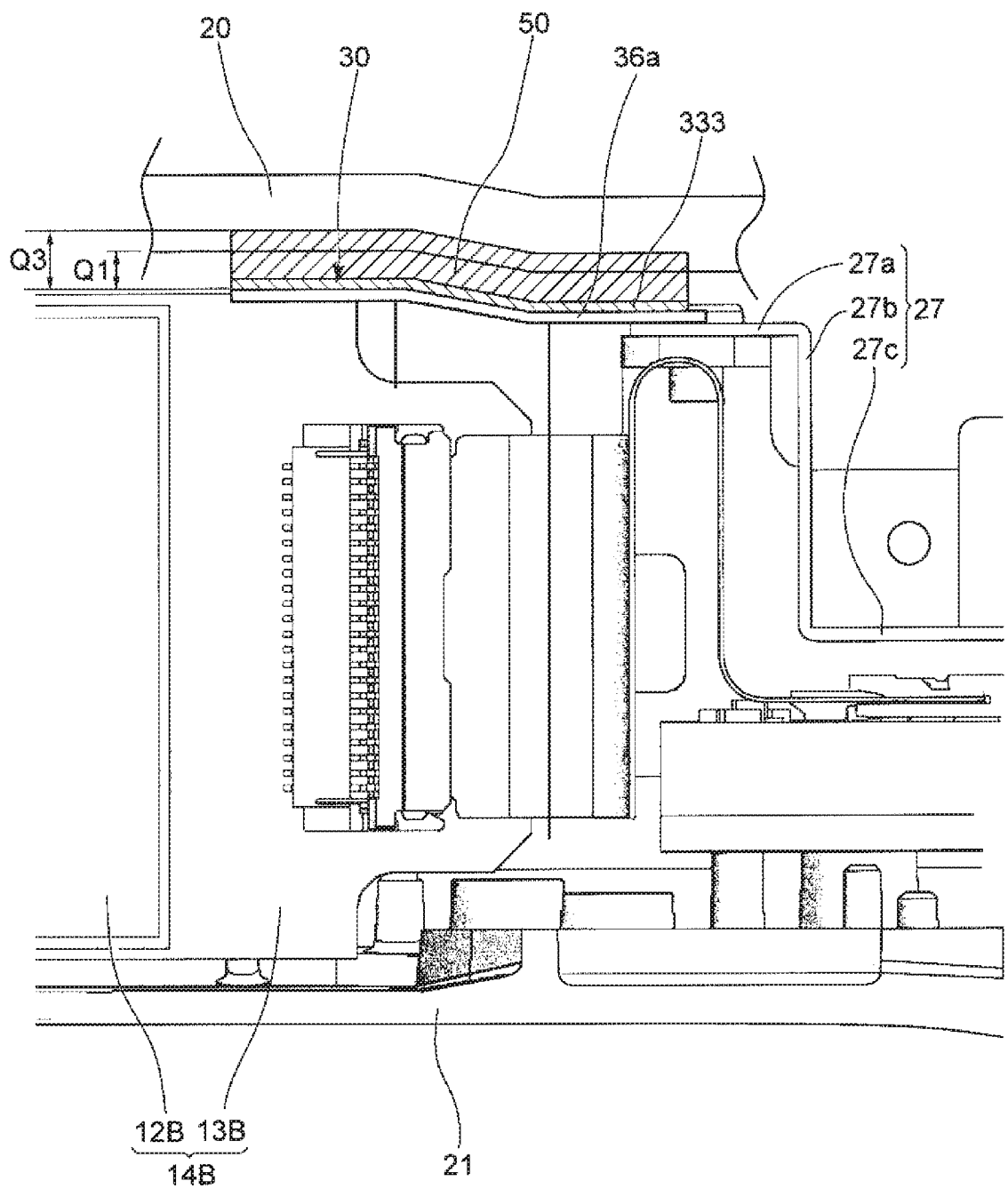
FIG. 17 is a cross-sectional view of a heat-dissipation structure of an imaging apparatus, according to a third modification of an embodiment.
Figure 17:
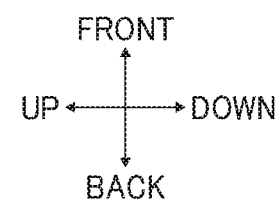

Each base 38 is made of a metal plate material, and includes a side wall 38a and a bottom wall 38b (see FIG. 16). The side wall 38a surrounds the sides of a corresponding heat storage member 40, and the bottom wall 38b supports the back face of a corresponding heat storage member 40. The front-face side of the base 38 is open, and the front face of the heat storage member 40 is exposed forward. The base 38 and the heat storage member 40 constitute a holder to hold the elastic member 35 (see FIG. 15).

Each of the heat dissipation sheets 30A and 30B includes a heat dissipating section 233. The heat dissipating section 233 includes an exterior contact 233a and a heat storage member contact 233b (heat storage body contact). The exterior contact 233a corresponds to the above-described heat dissipating section 33 according to an embodiment and the exterior contact 133a according to the first modification. The adhesive layer on the back face is attached to the front face of the elastic member 35, and no adhesive layer is formed on the front face of the exterior contact 233a.

The heat storage member contact 233b is formed by bending backward the side end (the left end of the heat dissipation sheet 30A and the right end of the heat dissipation sheet 30B) of the exterior contact 233a, and folding the bent side end to face the back side of the exterior contact 233a, so as to form a U shape. The heat storage member contact 233b is disposed between the back face of the elastic member 35 and the front face of the heat storage member 40. An adhesive layer is formed on the back face of the heat storage member contact 233b (the back face of the heat storage member contact 233b faces the front because the heat storage member contact 233b is folded upward), extending over the back face of the exterior contact 233a. The adhesive layer of the heat storage member contact 233b is attached to the back face of the elastic member 35. The front face of the heat storage member contact 233b (which faces backward because the heat storage member contact 233b is folded backward) faces the front face of the heat storage member 40. An adhesive layer is not formed on the heat storage member contact 233b, which means that the heat storage member contact 233b is not attached to the heat storage member 40.

Figure 13:
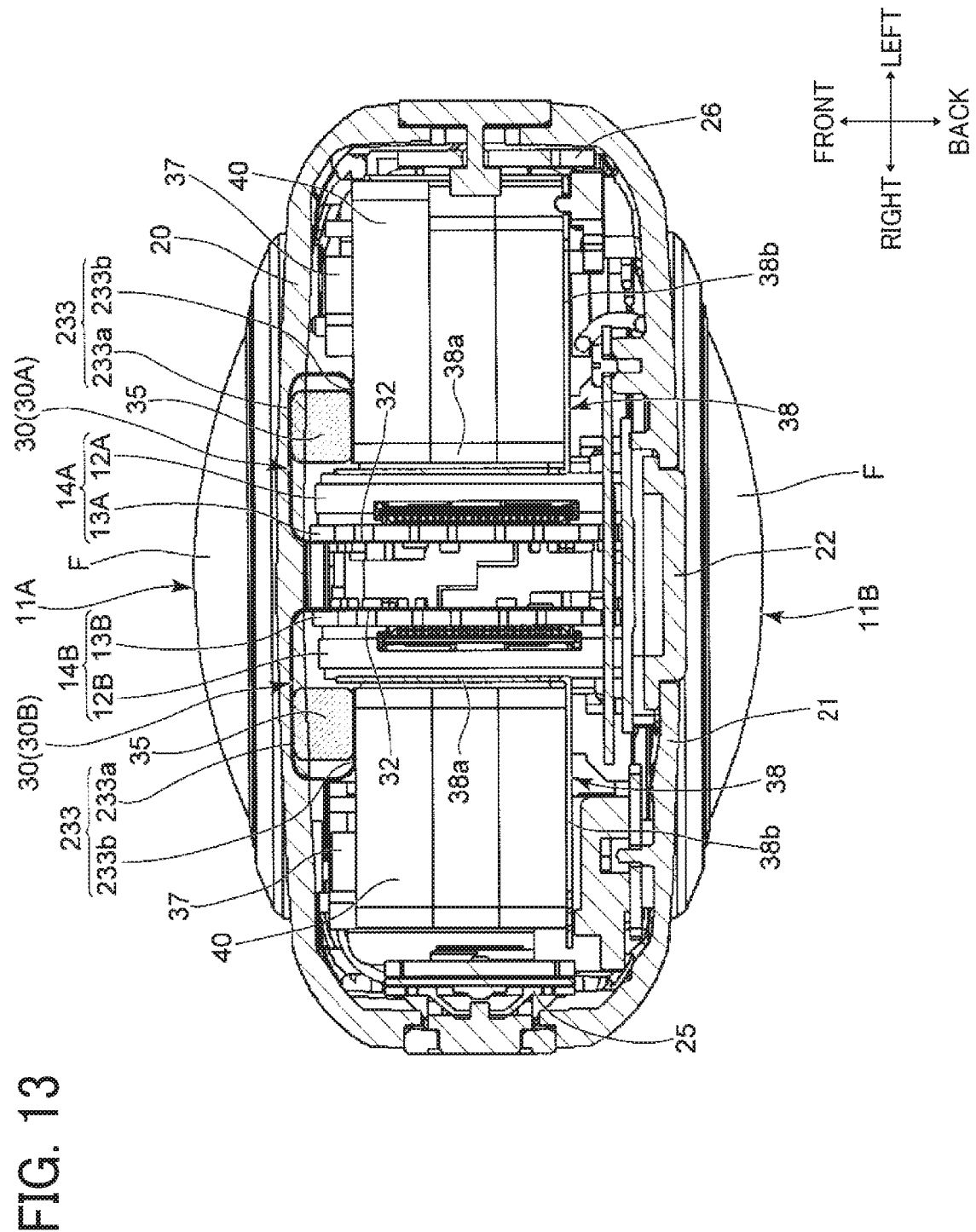
FIG. 13 is a cross-sectional view of an area hear the heat dissipation sheet as viewed from a direction of arrow XIII in FIG. 12.
Figure 14:
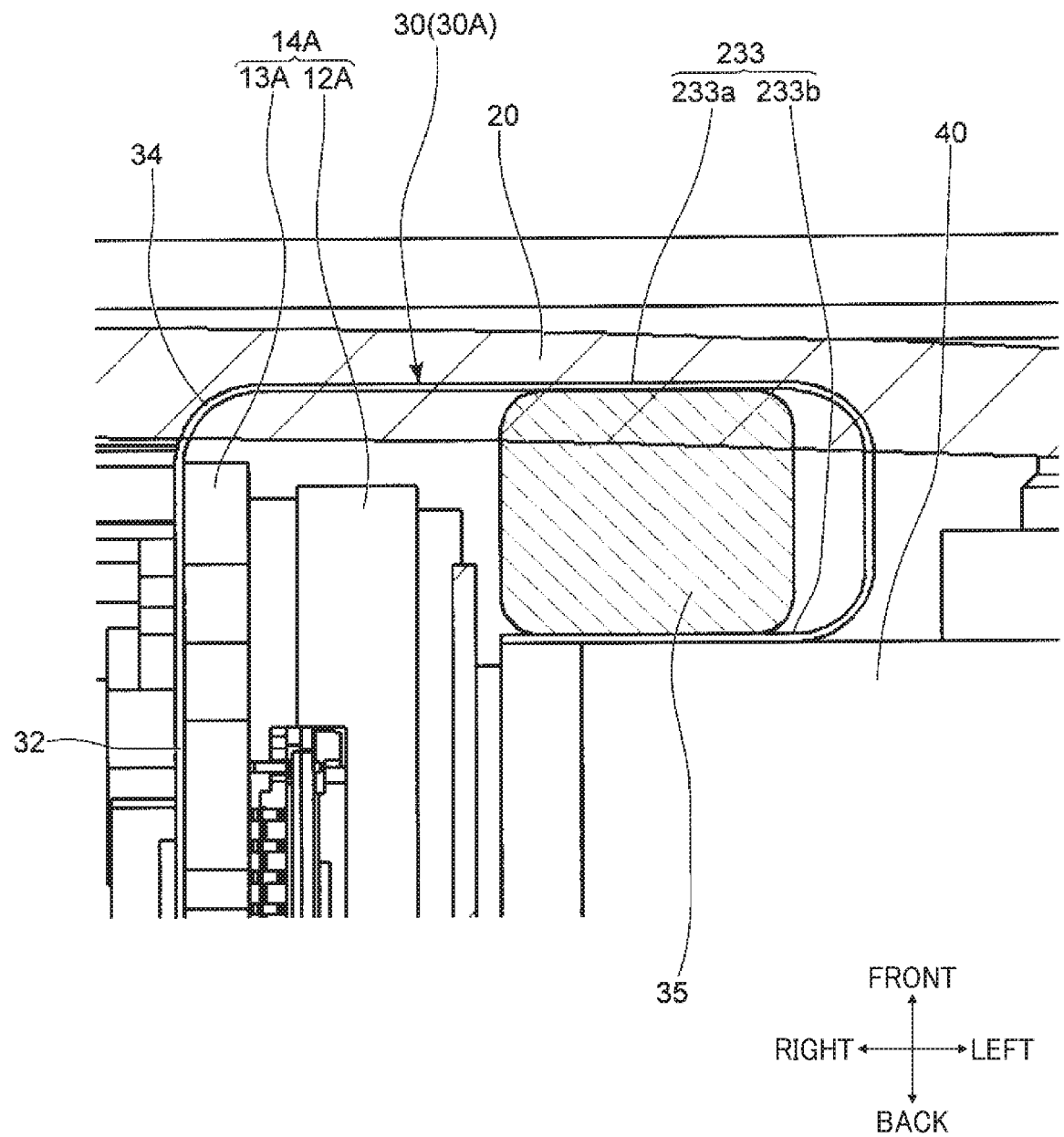
FIG. 14 is an enlarged cross-sectional view of a part of FIG. 13.
Figure 15:
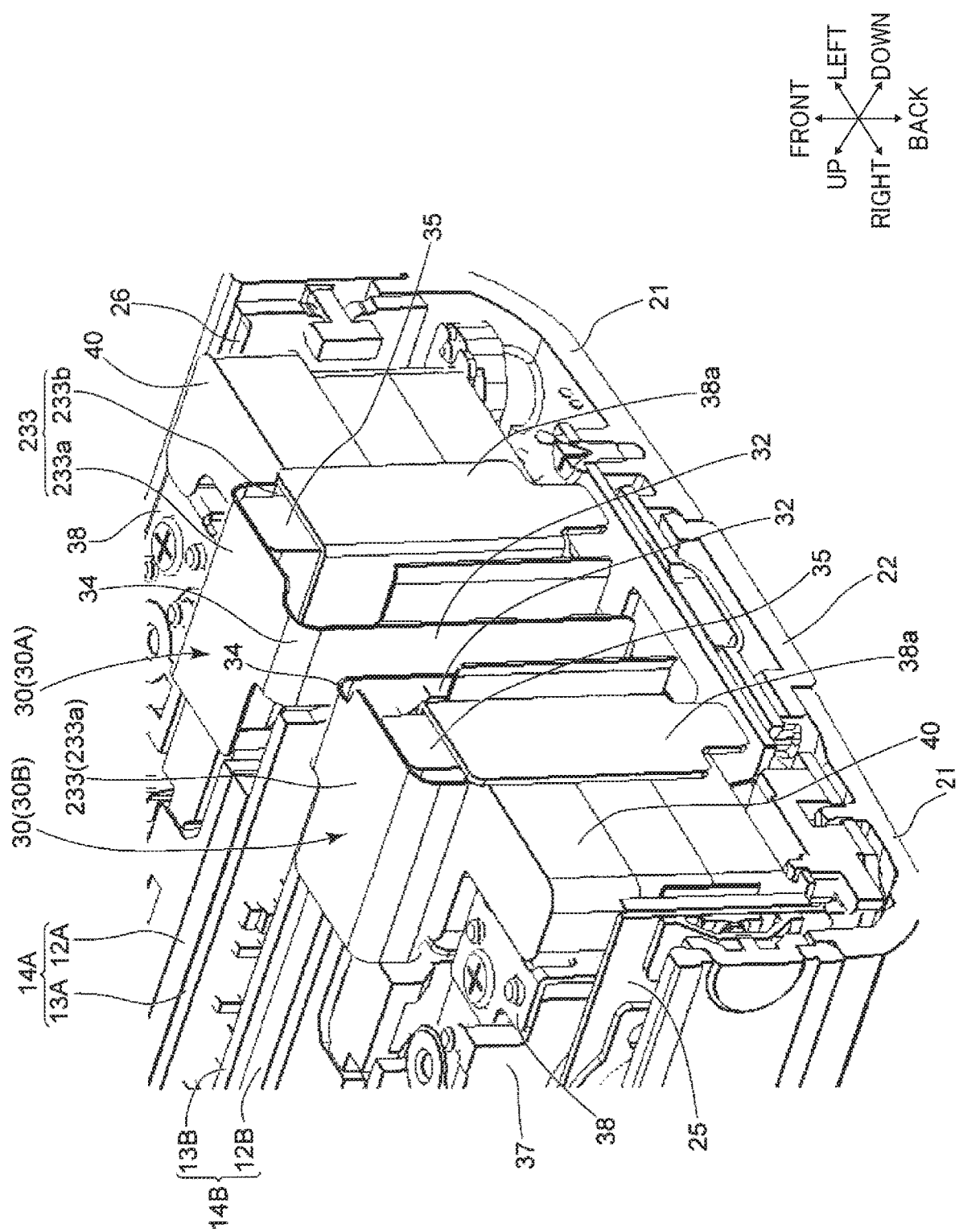
FIG. 15 is a perspective view of a part of the heat-dissipation structure according to the second modification.

FIGS. 13 and 14 are illustrations of the position of the exterior contact 233a when the front cover 20 is not attached to the rear cover 21, that is, at the first state of the elastic member 35 that is not compressively deformed. In this state, the exterior contact 233a is positioned in the front of the inner surface of the front cover 20. In this configuration, when the front cover 20 is attached to the rear cover 21, the exterior contact 233a of each of the heat dissipation sheets 30A and 30B is brought into contact with the inner surface of the front cover 20, which presses the exterior contact 233a backward. The elastic member 35 is held (supported) by the heat storage member 40 and the base 38, and the backward movement of the elastic member 35 is restricted. Accordingly, when the exterior contact 233a is pressed against the elastic member 35, the elastic member 35 is compressed and deformed to cause the exterior contact 233a to close contact (be compressed against) the inner surface of the front cover 20. As a result, a heat-transfer path is formed to transfer neat from the exterior contact 233a to the front cover 20, so as to enable the heat generated by the image sensors 12A and 12B to be dissipated to the front cover 20.

When the front cover 20 is attached to the rear cover 21 so that the elastic member 35 is compressively deformed, the heat storage member contact 233b at the back of the elastic member 35 is pressed backward. Then, the heat storage member contact 233b is pressed against the front face of the heat storage member 40. This configuration forms another heat-transfer path from the heat storage member contact 233b to the heat storage member 40, in addition to the above-described heat-transfer path from the exterior contact 233a to the front cover 20. This configuration further enables the heat to be dissipated from the heat dissipation sheets 30A and 30B to the corresponding heat storage members 40, which can increase the heat dissipation property. The heat stored in the heat storage member 40 is gradually released to the surroundings.

The heat storage member contact 233b is configured to be compressed and held between the elastic member 35 and the heat storage member 40 when the front cover 20 is attached to the rear cover 21. With this arrangement, the exterior contact 233a can be reliably maintained in contact with the heat storage member 40 to which the heat is to be dissipated same as the exterior contact 233a and the heat dissipating section 33, without attaching the heat storage member contact 233b to the heat storage member 40 by, for example, adhesive. Accordingly, the front cover 20 as well as the heat storage member 40 can be removed without any damage on the heat dissipating section 233, which can reduce the time and cost for replacement of the heat dissipation sheet 30.

Figure 7:
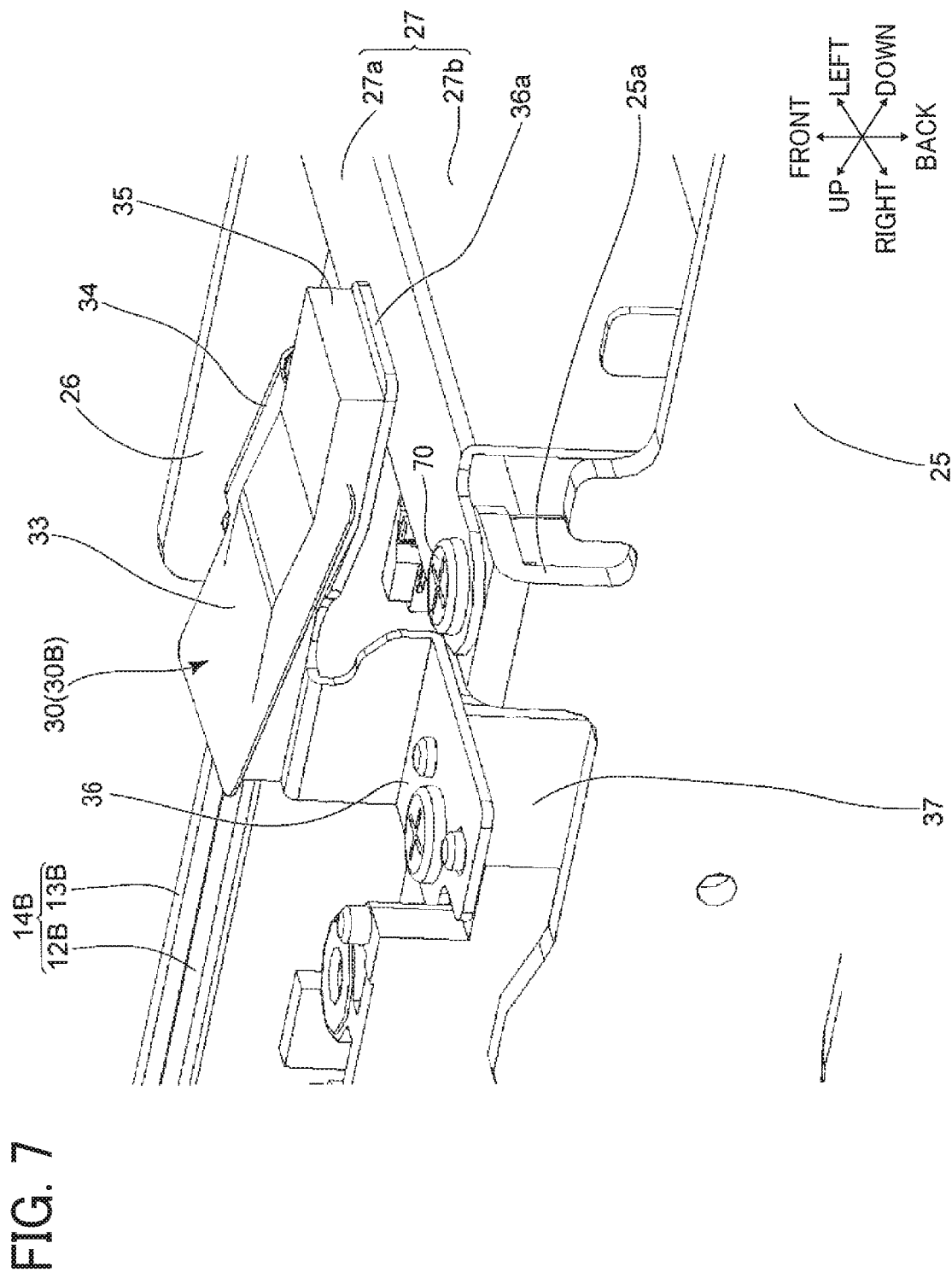
FIG. 7 is a perspective view of an area near a heat dissipation sheet in the imaging apparatus in FIGS. 1A and 1B.

In the second modification, it is also possible to adopt the configuration in which the shape (a component, such as the support plate 36a of the base 36, as illustrated in FIG. 7) to be connected to the transverse plate 27 is added to the base 38 so as to facilitate a dissipation of the heat of the heat storage member 40 from the base 38 to the metal frame (the side plates 25 and 26, and the transverse plate 27).

As described above in the embodiment, the first and second modifications, the imaging apparatus 10 has the configuration in which the elastic member 35 is compressed and deformed between the holder (the base 36, the base 38, and the heat storage member 40) and the front cover 20 attached to the rear cover 21. The deforming of the elastic member 35 causes the heat dissipating sections 33, 133, and 233 of the heat dissipation sheets 30A and 30B to be compressed against the inner surface of the front cover 20. With this configuration, it is possible to form a heat transfer path excellent in heat dissipation efficiency without attaching the heat dissipation sheets 30A and 30B to the front cover 20. Thus, there is no need to connect the heat dissipation sheets 30A and 30B to the front cover 20 in attaching the front cover 20 to the rear cover 21, and also no need to replace the heat dissipation sheets 30A and 30B with new ones in removing the front cover 20. Accordingly, a simple and easy-maintenance heat-dissipation structure can be obtained.

Particularly, in the imaging apparatus 10, the two image-sensor units 14A and 14B are disposed close to each other with the board surfaces (BS) (image-sensor boards 13A and 13B) facing each other. This configuration provides a highly-useful heat-dissipation structure with a high heat dissipation property, space saving, and ease of maintenance. The heat dissipation sheets 30A and 30B are disposed in parallel with the heat dissipating section 333 (133 and 233) facing in the same direction (forward), and two heat-transfer paths from the heat dissipation sheets 30A and 30B to the front cover 20 are formed merely by attaching the front cover 20 to the rear cover 21. This configuration simplifies an assembly and a disassembly of the imaging apparatus 10 including the heat-dissipation structure while enabling a plurality of image sensors 12A and 12B to be incorporated into the imaging apparatus 10.

In any of the above embodiment, the first and second modifications, the heat dissipating section 33/133 (the exterior contact 133a)/233 (the exterior contact 233a), the elastic member 35, and the holder (the base 36, the base 38, and the heat storage member 40) are disposed on top of one another in that order from the inner surface of the front cover 20. Further, the heat dissipating section 33/133 (the exterior contact 133a)/233 (the exterior contact 233a) of the heat dissipation sheet 30 are brought into contact with the inner surface of the front cover 20. FIG. 17 is an illustration of a configuration according to a third modification in which the elastic member 50 is in contact with the inner surface of the front cover 20. The configuration according to the third modification is the same as the configuration according to the embodiment illustrated, for example, in FIG. 9 except for the heat dissipating section 333 of the heat dissipation sheet 30 and the elastic member 50. The description of the same configuration is omitted. Although FIG. 17 illustrates a set of the heat dissipation sheet 30 and the elastic member 50, it is assumed that two sets of heat dissipation sheet 30 (the heat dissipating section 333) and the elastic member 50 are arranged in parallel, corresponding to the image sensors 12A and 12B, respectively.

The heat dissipation sheet 30 is attached to the support plate 36a of the base 36 via the adhesive layer on the back of the heat dissipating section 333. That is, the heat dissipating section 333 is directly supported by the support plate 36a without the elastic member 50.

The elastic member 50 is made of material that is elastically deformable and has high thermal conductivity. The adhesive layer on the back face of the elastic member 50 is attached to the front face of the heat dissipating section 333, which enables heat to be transferred from the heat dissipating section 33 to the elastic member 50. An adhesive layer is not formed on the front face of the elastic member 50, and the front face of the elastic member 50 is exposed to the outside when the front cover 20 is not attached to the rear cover 21.

The front cover 20 partially illustrated in FIG. 17 is at a position when attached to the rear cover 21. The elastic member 50 in FIG. 17 is neither compressed nor deformed, that is, the elastic member 50 is at the first state. When Q1 denotes the distance between the support plate 36a and the inner surface of the front cover 20 and Q3 denotes the distance between the support plate 36a and the front face of the elastic member 50 (the sum of the thicknesses of the elastic member 50 and the heat dissipating section 333), the relation that Q1 is smaller than Q3 (Q1<Q3) is satisfied. That is, the elastic member 50 at the first state projects forward (to the front as indicated by arrow in FIG. 9) beyond the inner surface of the front cover 20 attached to the rear cover 21.

In such a configuration, when the front cover 20 is attached to the rear cover 21, the inner surface of the front cover 20 contacts the front face of the elastic member 50 to press the elastic member 50 while causing the elastic member 50 to be compressed and deformed, the elastic member 50 whose backward movement is restricted by the support plate 36a with the heat dissipating section 333 disposed between the elastic member 50 and the support plate 36a. The front surface of the elastic member 50 is pressed against the inner surface of the front cover 20 due to the restoring action of the elastic member 50. As a result, the front surface of the elastic member 50 is compressed against (becomes close contact with) the inner surface of the front cover 20. With the front cover 20 is maintained attached to the rear cover 21, this compression (close contact) state is maintained. This configuration enables the heat to be transferred from the heat dissipating section 333 to the front cover 20 through the elastic member 50, which thus enables the heat generated by the image sensor 12 to be dissipated to the exterior component, such as the front cover 20 made of metal, over a wide area using the heat dissipation sheet 30 and the elastic member 50.

The back face of the heat dissipating section 333 is in contact with the support plate 36a of the base 36. This arrangement also enables heat to be transferred from the heat dissipating section 333 to the front plate 27a of the transverse plate 27 through the support plate 36a. That is, as in the first modification illustrated in FIGS. 10 and 11, a heat dissipation route through the metal frame (the side plates 25 and 26, and the transverse plate 27) is also formed, which increases heat dissipation property.

In the third modification, the elastic member 50 is merely compressed against the front cover 20 without any attachment by, for example, adhesive. In this configuration, the heat dissipation sheet 30 and the elastic member 50 might not be damaged when the front cover 20 is removed from the imaging apparatus 10. Thus, the configuration according to the third modification provides a simple and easy-maintenance structure to enable the heat generated by the image sensor 12 to be effectively dissipated to the exterior component, such as the front cover 20, same as in the above-described embodiment, the first and second modifications.

Figure 18:
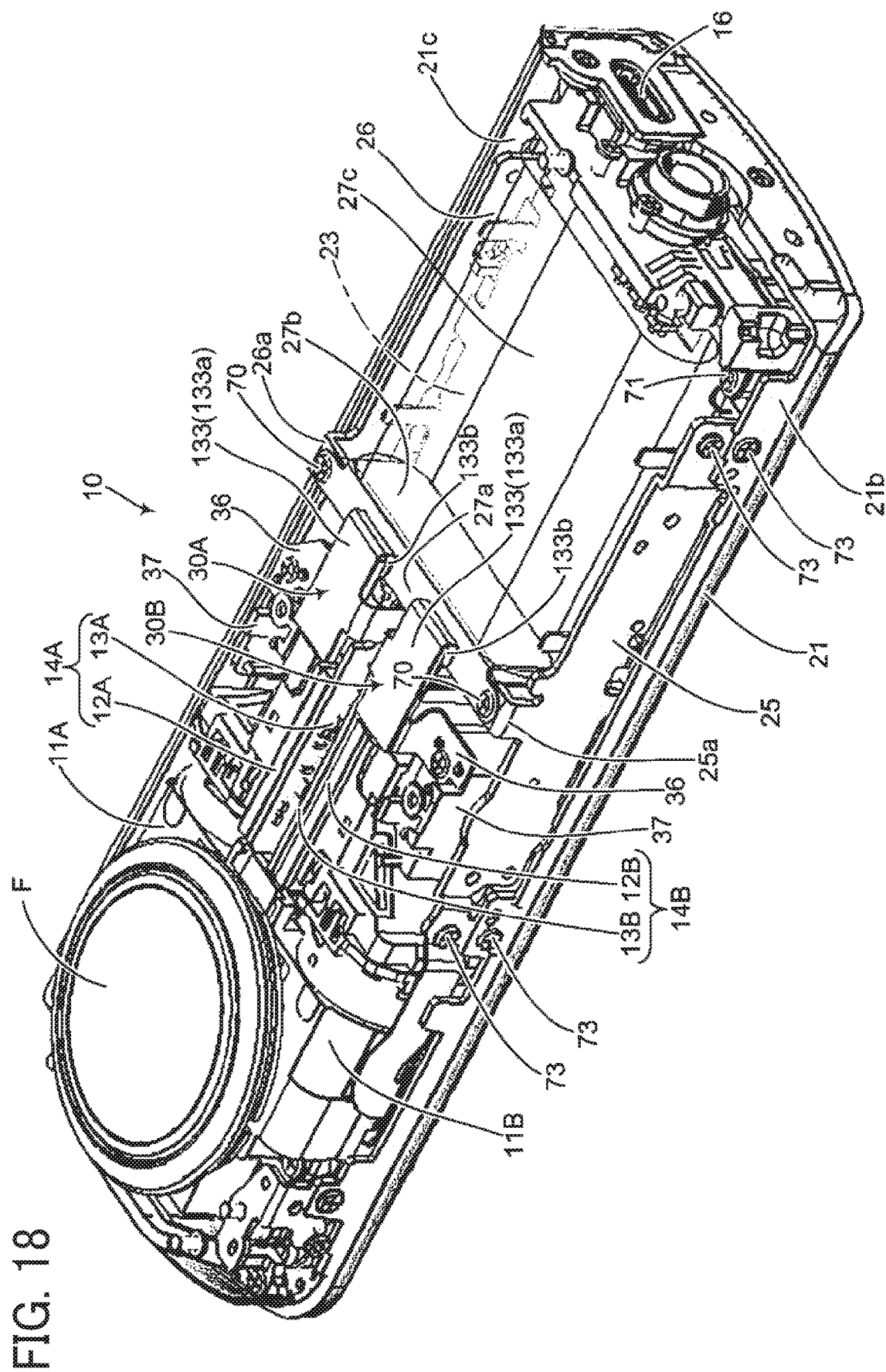
FIG. 18 is a perspective view of the imaging apparatus with a front cover removed.
Figure 19:
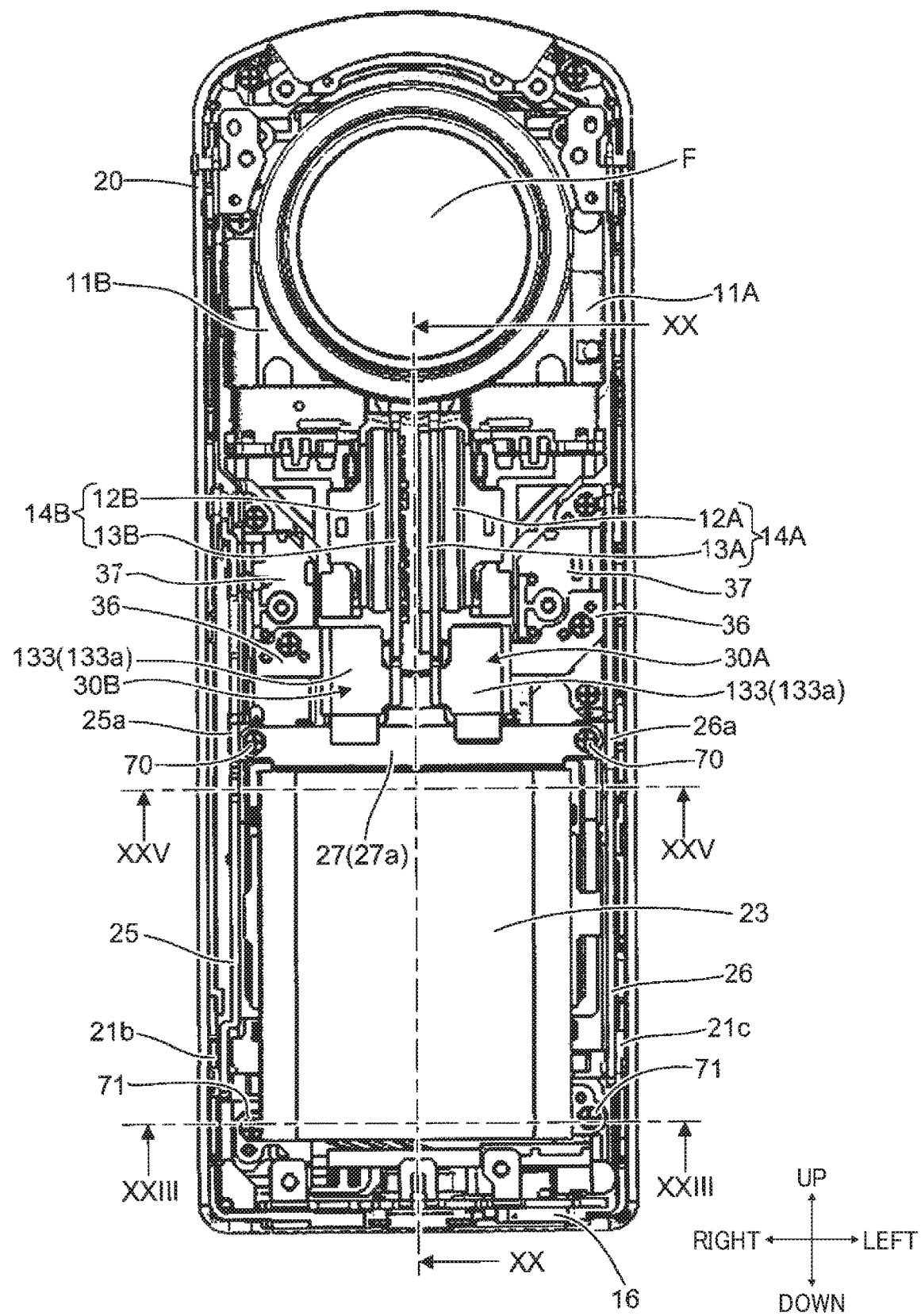
FIG. 19 is a front view of the imaging apparatus with the front cover removed.

Next, a description is given of dissipation of heat from a heat source other than the image sensors 12A and 12B in the imaging apparatus 10, referring to FIGS. 18 to 26. In FIG. 18 and following figures, the configuration according to the first modification (provided with the heat dissipating section 133 in each of the heat dissipation sheets 30A and 30B) is applied to the dissipation of heat from the image sensors 12A and 12B. That is, the exterior contact 133a of the heat dissipating section 133 contacts the inner surface of the front cover 20, and the frame contact 133b is disposed between the support plate 36a and the front plate 27a.

Figure 20:
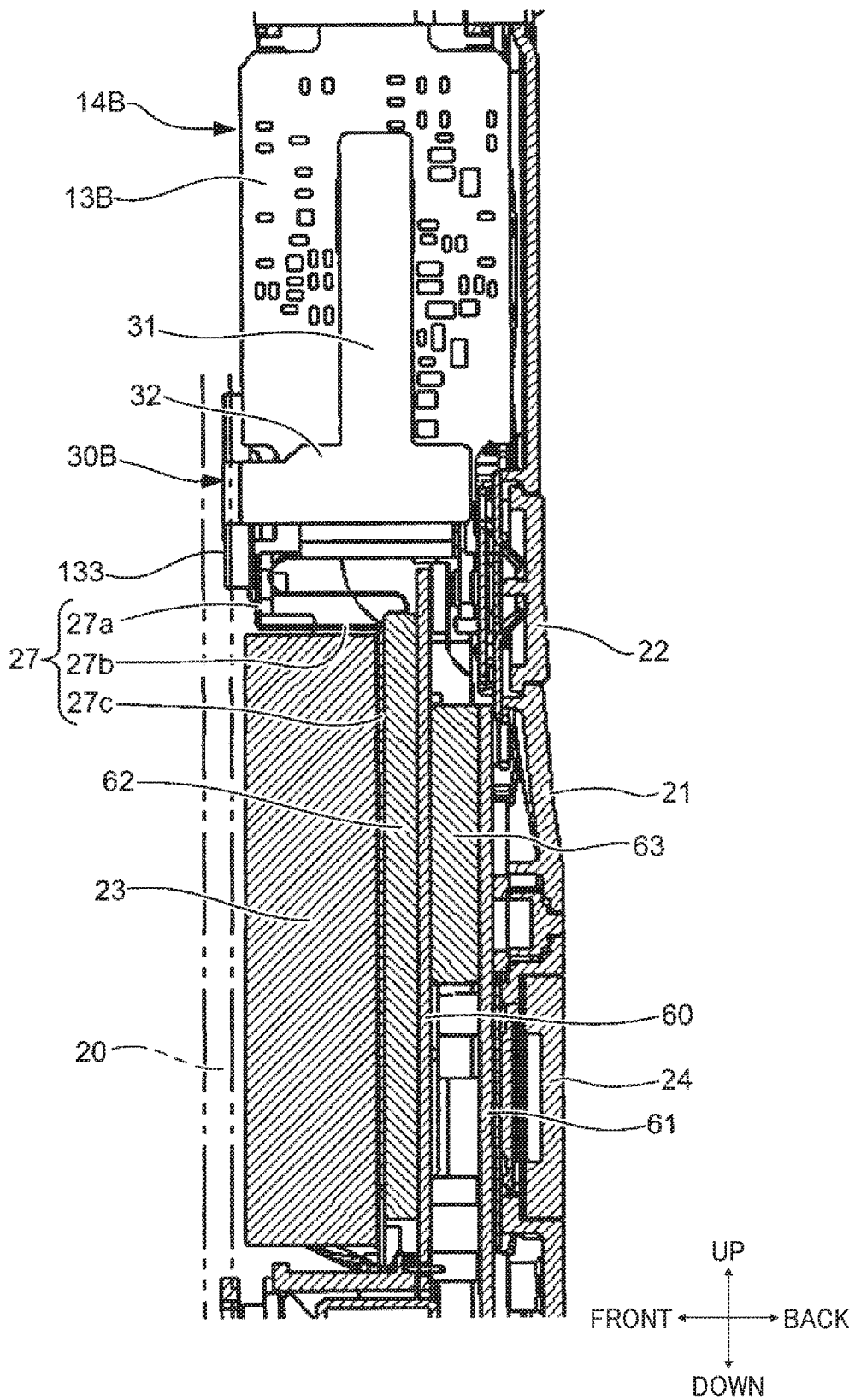
FIG. 20 is a cross-sectional view of the imaging apparatus taken along line XX-XX in FIG. 19.
Figure 21:
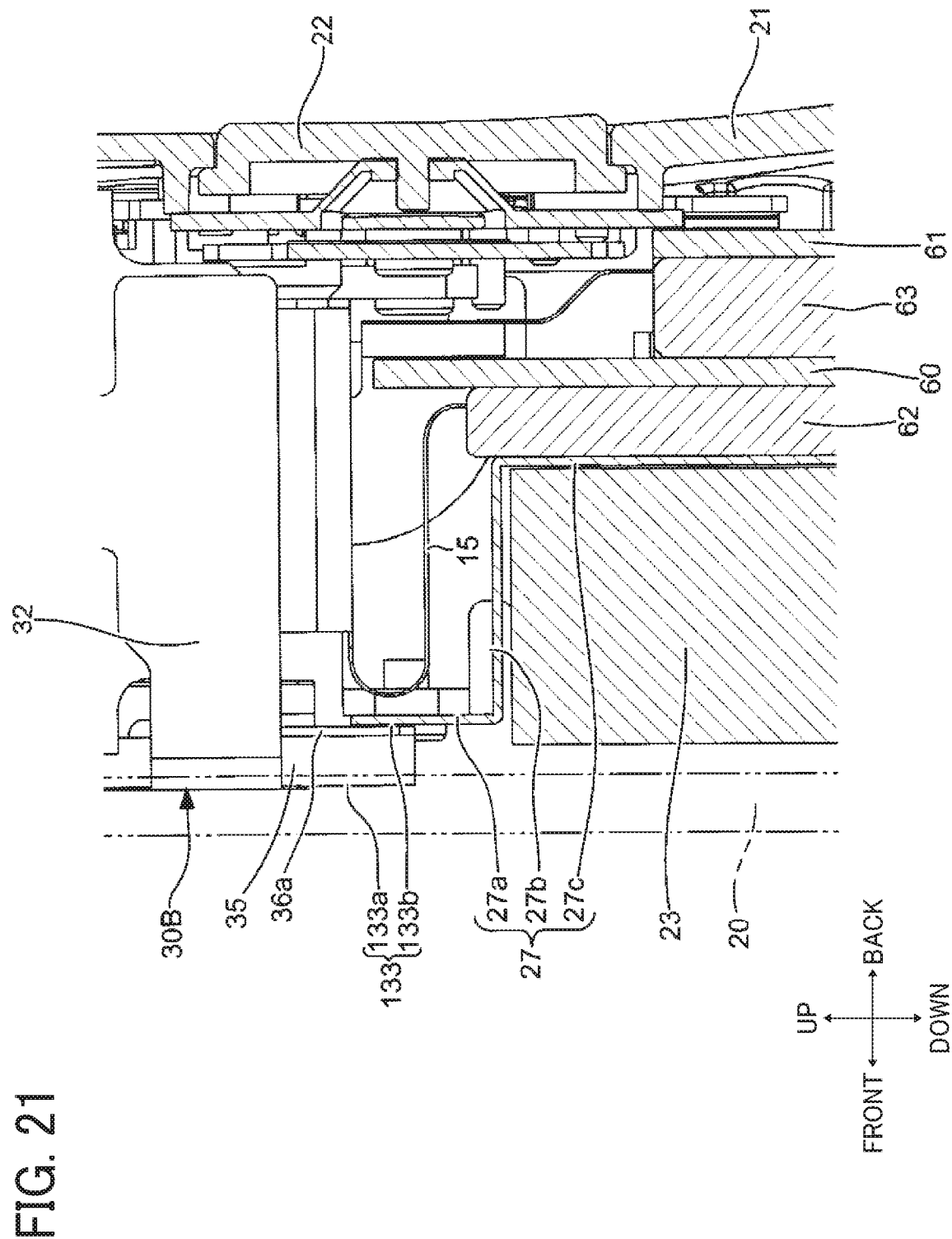
FIG. 21 is an enlarged cross-sectional view of a part of the imaging apparatus in FIG. 20.
Figure 22:
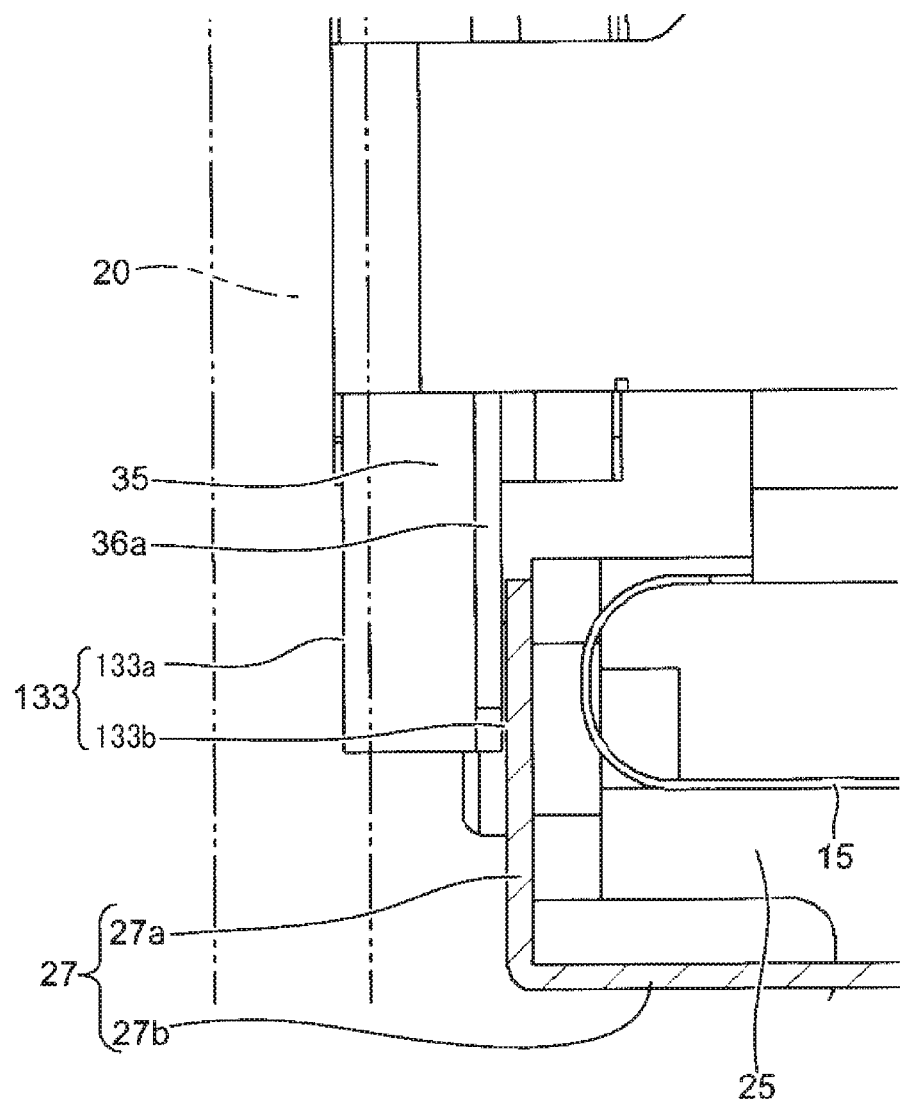
FIG. 22 is an enlarged cross-sectional view of a part of the imaging apparatus in FIG.

As illustrated in FIGS. 20 and 21, a first board 60 and a second board 61 are incorporated in the imaging apparatus 10. As described above, the battery 23 is disposed (supported) on the front side of the bottom plate 27c of the transverse plate 27. A thermal diffusion body 62 is disposed in contact with the back face of the bottom plate 27c, and the first board 60 is disposed in contact with the back face of the thermal diffusion body 62. Further, a thermal diffusion body 63 is disposed in contact with the back face of the first board 60, and the second board 61 is disposed in contact with the back face of the thermal diffusion body 63.

The first board 60 is an electronic circuit board provided with, for example, a controller configured to control the imaging apparatus 10 in a centralized manner and an image processing unit to process an image captured by the optical unit 11. The second board 61 is an electronic circuit board that serves to input operation signals (for example, the shutter button 22, the power button 28, and operation button 29) of various kinds of operation parts, input/output signals through the external connector 16, and control displaying of the display unit 24.

Figure 23:
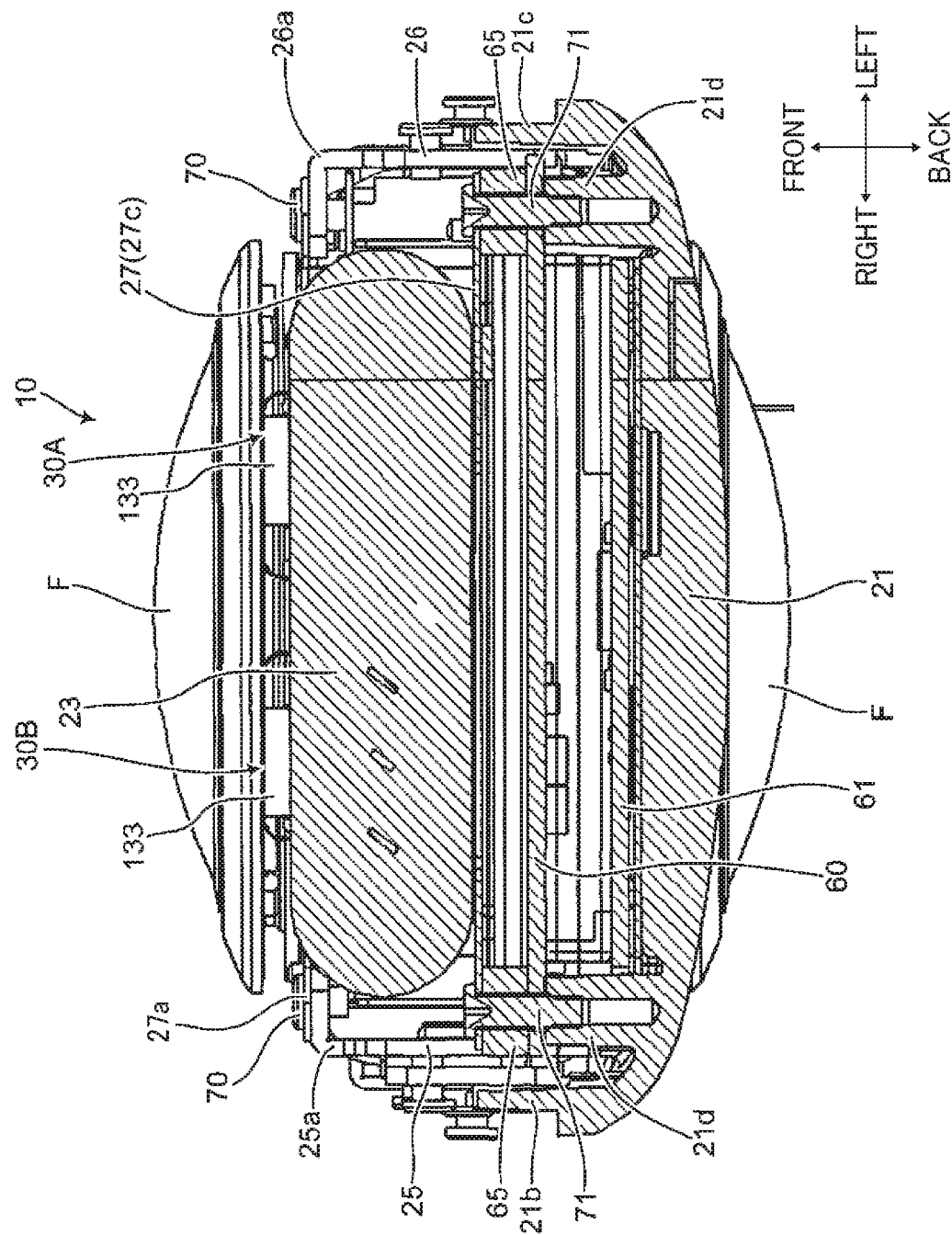
FIG. 23 is a cross-sectional view of the imaging apparatus taken along the line XXIII-XXIII in FIG. 19.
Figure 24:
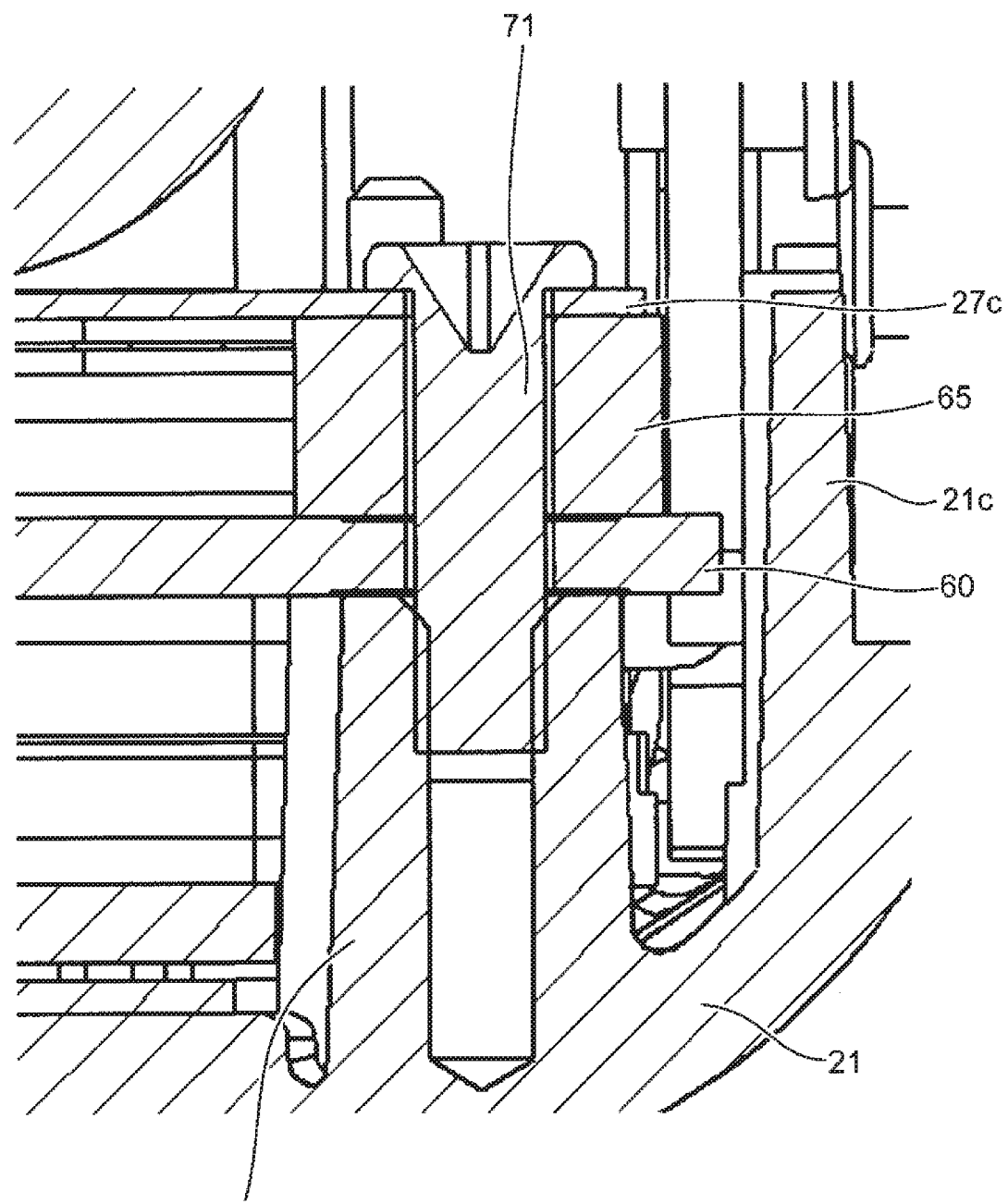
FIG. 24 is an enlarged cross-sectional view of a part of the imaging apparatus in FIG. 23.

As illustrated in FIGS. 23 and 24, the rear cover 21 is provided with a plurality of bosses 21d each projecting forward. The plurality of bosses 21d is disposed at different position along the right-right-to-left direction, each boss 21d has a screw hole inside. The first board 60 is disposed on the front-end face of each boss 21d, and the resin spacer 65 is disposed on the front face of the first board 60. Further, a bottom plate 27c (a plate) of the transverse plate 27 is disposed on the front face of the spacer 65. Through-holes communicable with the screw holes of the bosses 21d are formed in the bottom plate 27c, the spacer 65, and the first board 60, respectively. A shaft of each screw 71 is inserted into a through-hole from the front side. An external screw formed on the shaft of the screw 71 is screwed into a screw hole of the boss 21d. When the screw 71 is tightened with a certain torque with the head of the screw 71 in contact with the bottom plate 27c, the bottom plate 27c, the spacer 65, and the first board 60 are held (disposed) between the head of the screw 71 and the boss 21d. The screws 71 are positioned on the lower side of the imaging apparatus 10 (see FIGS. 5, 6, and 8).

Figure 25:
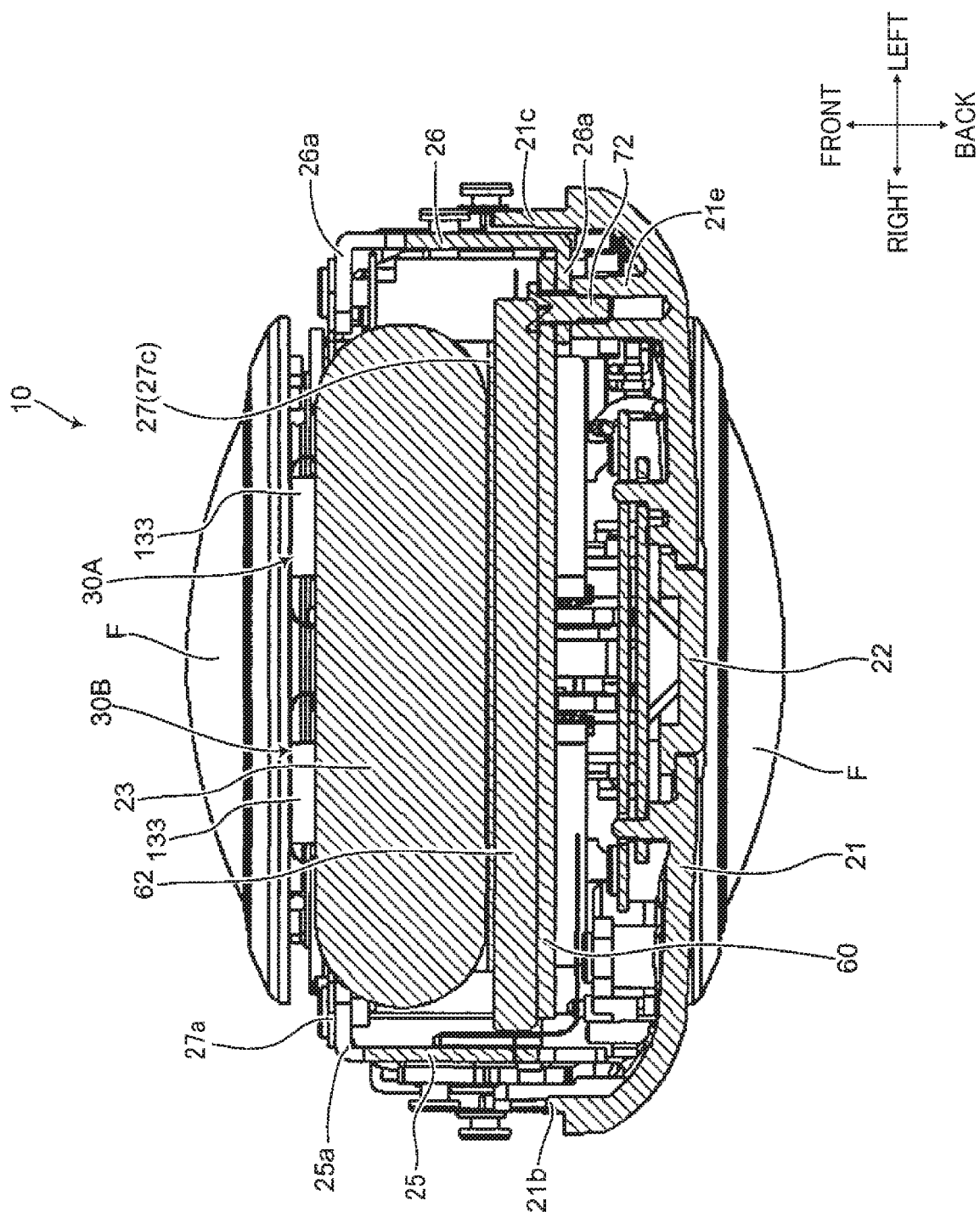
FIG. 25 is a cross-sectional view of a part of the imaging apparatus taken along line XXV-XXV in FIG. 19.
Figure 26:
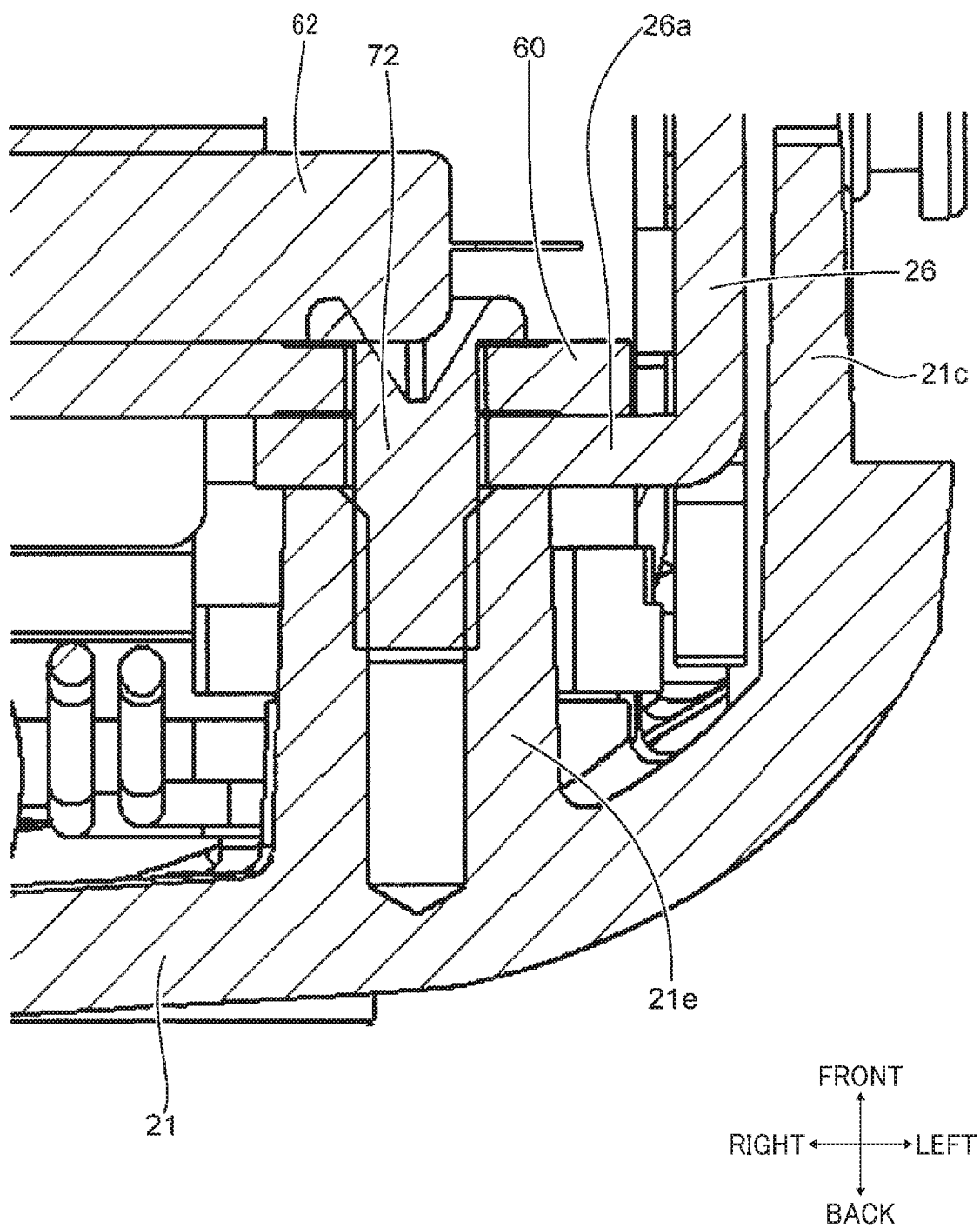
FIG. 26 is an enlarged cross-sectional view of a part of the imaging apparatus in FIG. 25.

As illustrated in FIGS. 25 and 26, the rear cover 21 further includes a boss 21e at a position above the boss 21d. A screw hole is formed inside the boss 21e. The side plate 26 has a bending section 26b to bend inwardly (to the right) of the imaging apparatus 10. The bending section 26b is superimposed on the front-end face of the boss 21e, and the back face of the first board 60 is superimposed on the front face of the bending section 26b. Through-holes communicable with the screw holes of the bosses 21e are formed in the first board 60 and the bending section 26b, respectively. A shaft of each screw 72 is inserted into each through-hole from the front side. An external screw formed on the shaft of the screw 72 is screwed into a screw hole of the boss 21e. When the screw 72 is tightened with a certain torque with the head of the screw 72 in contact with the first board 60, the first board 60 and the bending section 26b are held (disposed) between the head of the screw 72 and the boss 21e.

As illustrated in FIGS. 20 and 23, the second board 61 is disposed at a position at the back of the first board 60, and is supported by the inner surface of the rear cover 21. When the first board 60 is attached to the imaging apparatus 10 with the above-described screws, the thermal diffusion body 63 is held between the first board 60 and the second board 61. The thermal diffusion body 63 is in close contact with both the first board 60 and the second board 61. When the first board 60 is attached to the imaging apparatus 10 with the above-described screws, the thermal diffusion body 63 is held between the first board 60 and the bottom plate 27c of the transverse plate 27. The thermal diffusion body 62 is in close contact with both the bottom plate 27c and the first board 60.

Both the first board 60 and the second board 61 serve as heat sources (a heating body) that generate heat during processing of the mounted circuit and the like, and in particular, the amount of heat generated by the first board 60 is large. Further, the battery 23 also serves as a heat source (a heating body). The heat generated by the first board 60 is absorbed and diffused by the thermal diffusion bodies 62 and 63, which are disposed at the front and back of the first board 60. The heat generated by the second board 61 is absorbed and diffused by the thermal diffusion body 63 in contact with the front side of the second board 61. The bottom plate 27c of the transverse plate 27 is in contact with the front face of the thermal diffusion body 62, and the heat absorbed by the thermal diffusion body 62 is transmitted from the bottom plate 27c to the transverse plate 27. Further, the heat generated by the battery 23 is also transmitted from the bottom plate 27c to the transverse plate 27.

As described above, the transverse plate 27 is attached to the fastening sections 25a and 26a of the side plates 25 and 26 with the screws 70, and the heat received by the bottom plate 27c is transmitted to the side plates 25 and 26. The side plates 25 and 26 are attached to the rear cover 21 with the screws 73 and 74, and are attached to the front cover 20 as well to allow for the heat transfer.

Further, the frame contact 133b of the heat dissipating section 133 is in contact with the front plate 27a of the transverse plate 27, and the heat received by the transverse plate 27 is transferred to the front cover 20 through the heat dissipating section 133 of the heat dissipation sheets 30A and 30B.

This configuration forms a heat-transfer path from the first board 60, the second board 61, and the battery 23 to the thermal diffusion bodies 62 and 63, the transverse plate 27, the side plates 25 and 26, and the heat dissipation sheets 30A and 30B, and to the front cover 20 and the rear cover 21.

Further, as illustrated in FIG. 24, the rear face of the first board 60 is in contact with the front-end face of the boss 21d, and the heat of the first board 60 is directly transferred to the rear cover 21 through the boss 21d. Further, the head of the screw 71 is in contact with the bottom plate 27c of the transverse plate 27, and the heat can be transferred to the transverse plate 27 through the screw 71.

As illustrated in FIG. 26, the back face of the first board 60 is in contact with the bending section 26b of the side plate 26, and the front face of the first board 60 is in contact with the head of the screw 72. With this configuration, the heat of the first board 60 can be transferred to the bosses 21e and the like of the rear cover 21 through the screws 72.

As described above, the imaging apparatus 10 according to the embodiments of the present disclosure enables heat generated by the heat sources, such as the first board 60, the second board 61, and the battery 23, in addition to the image sensors 12A and 12B, to be effectively dissipated to the exterior components such as the front cover 20 and the rear cover 21.

In particular, such a configuration provides the first board 60, which generates a great amount of heat, an advantageous heat-dissipation property by forming a plurality of heat-transfer paths. Specifically, the heat of the first board 60 can be dissipated through, for example, the heat-transfer path to the bottom plate 27c of the transverse plate 27 through the thermal diffusion body 62 and the screws 71, the heat-transfer path to the boss 21d of the rear cover 21, the heat-transfer path to the bending section 26b of the side plate 26, and the heat-transfer path to the boss 21e of the rear cover 21 through the screws 71.

These heat-transfer paths also contribute to the heat dissipation for the second board 61 because the second board 61 contacts the first board 60 with the thermal diffusion body 63 disposed between the first board 60 and the second board 61.

The battery 23 is accommodated in a space (the front side of the bottom plate 27c) formed by the transverse plate 27, and the bottom plate 27c is disposed between the battery 23 and the first board 60 along the front-to-back direction. With such an arrangement, two heat sources (the first board 60 and the battery 23), whose generated heat is to be dissipated to the transverse plate 27, are arranged compactly with the bottom plate 27c (a heat-dissipation target) disposed between the first board 60 and the battery 23.

As described above, the transverse plate 27 constituting the internal frame of the imaging apparatus 10 is capable of receiving the heat generated by the image sensors 12A and 12B using the heat dissipation sheets 304 and 30B. Further, the heat generated by the boards 60 and 61, and the battery 23 can also be transferred to the transverse plate 27. That is, the image sensors 12A and 12B, the first board 60, the second board 61, and the battery 23 share the internal frame (the transverse plate 27) as the heat-transfer path. This configuration provides a heat-transfer structure for a plurality of heat sources within a limited internal space of the imaging apparatus 10.

In the configuration illustrated in FIGS. 18 to 26, the frame contacts 133b of the heat dissipation sheets 30A and 30B are in contact with the front plates 27a of the transverse plate 27. In this configuration, since the heat dissipation sheets 30A and 30B are in direct contact with the transverse plate 27, an effective heat transfer can be performed in any of cases in which the heat generated by the image sensors 12A and 12B is transferred to the transverse plate 27 and in which the heat is transferred from other heat sources (the first board 60, the second board 61, and the battery 23) to the heat dissipation sheets 30A and 30B through the transverse plate 27. However, any components that is capable of transferring heat to the heat dissipation sheets 30A and 30B other than the frame contact 133b may be used to contact the front plate 27a of the transverse plate 27. For example, the configurations illustrated in FIGS. 5 to 9 also enables heat to be dissipated from the heat dissipating section 33 to the front plate 27a using the support plate 36a of the base 36 and the elastic member 35 if the elastic member 35 is made of material having high thermal conductivity.

Although the embodiments and modifications have been demonstrated described above, the present disclosure is not limited to such specific embodiments and modifications, and other embodiments and modifications may be used without departing from the spirit and scope of the present disclosure. For example, the embodiments and modifications of the present disclosure are particularly effective in the imaging apparatus provided with a spherical imaging system according to the above-described embodiments, and more effective in the configuration in which a plurality of image sensors are arranged with the board surfaces (BS) facing each other. However, the embodiments and modifications of the present disclosure are also applicable in imaging apparatuses provided with an imaging system other than a spherical imaging system.

As the imaging apparatus 10 according to the above-described embodiments is thin in the front-to-back direction, a sufficient area for the compressive contact can be obtained by compressing the heat dissipating section 33, 133, and 233 of the heat dissipation sheets 30A and 30B and the elastic member 50 against the front cover 20 and the rear cover 21 of the exterior components. The configuration that compresses the heat dissipating sections 33, 133, 233, and the elastic member 50 against the front cover 20 can improve maintainability and workability because the front cover 20 is attached to the rear cover 21 in the last to assemble the imaging apparatus 10. However, it is also possible to compress the heat dissipating sections 33, 133, 233 and the elastic member 50 against the rear cover 21. Depending on the overall shape of the imaging apparatus, the heat dissipating section and a heat conductive elastic member may be compressed against the exterior components that cover the up and down sides or the right and left sides of the imaging apparatus, instead of the front and rear covers.

Numerous additional modifications and variations are possible in light of the above teachings. It is therefore to be understood that within the scope of the appended claims, the embodiments may be practiced otherwise than as specifically described herein. For example, elements and/or features of different illustrative embodiments may be combined with each other and/or substituted for each other within the scope of this disclosure and appended claims.

What is claimed is:

1. An imaging apparatus, comprising:
an exterior component;
a plurality of image sensors disposed inside the exterior component, each image sensor including a board, each image sensor having an imaging plane and a board surface on an opposite side of the imaging plane, and the plurality of image sensors is disposed with the board surfaces facing each other;
a plurality of sheet bodies, each sheet body is provided with a corresponding image sensor of the plurality of image sensors to dissipate heat generated by the corresponding image sensor;
a plurality of elastic bodies, each elastic body configured to support a corresponding sheet body of the plurality of sheet bodies; and
a holder configured to hold the elastic bodies, wherein each sheet body includes:
a heat receiver attached to the board of the corresponding image sensor; and
a heat dissipating section attached to the corresponding elastic body,
each elastic body is compressively deformable between the exterior component and the holder, and
the heat dissipating section of each sheet body is directly compressed against an inner surface of the exterior component, facing a same direction.

2. The imaging apparatus according to claim 1, further comprising:
an internal frame made of metal and attached to the exterior component to support the holder, wherein
each heat dissipating section is configured to contact the internal frame.

3. The imaging apparatus according to claim 2, wherein each heat dissipating section includes a frame contact disposed between the holder and the internal frame.

4. The imaging apparatus according to claim 1, further comprising:
a heating body disposed inside the exterior component, the heating body being different from the plurality of image sensors, wherein
heat generated by the heating body is dissipated to the exterior component through a heat-transfer path.

5. The imaging apparatus according to claim 4, further comprising:
an internal frame made of metal and attached to the exterior component, the internal frame configured to support the holder, each heat dissipating section being configured to contact the internal frame, wherein
the heating body is a board attached to the internal frame, and the board is different from the board of the plurality of image sensors, and
the heat-transfer path includes the internal frame.

6. The imaging apparatus according to claim 5, wherein the exterior component includes a boss used to attach the board to the internal frame, and the board is in contact with the boss.

7. The imaging apparatus according to claim 5, further comprising:
a plate constituting the internal frame; and
a battery, wherein
the plate is disposed between the board and the battery.

8. An imaging apparatus, comprising:
an exterior component;
an image sensor disposed inside the exterior component, the image sensor including a board;
a sheet body to dissipate heat generated by the image sensor;
an elastic body configured to support the sheet body; and
a holder configured to hold the elastic body, wherein the sheet body includes:
a heat receiver attached to the board of the image sensor; and
a heat dissipating section attached to the elastic body,
the elastic body is compressively deformable between the exterior component and the holder to compress the heat dissipating section directly against an inner surface of the exterior component, and
the holder includes a heat storage body in contact with the heat dissipating section.

9. The imaging apparatus according to claim 8, wherein the heat dissipating section further includes a heat storage body contact disposed between the elastic body and the heat storage body.

10. The imaging apparatus according to claim 8, further comprising:
an internal frame made of metal and attached to the exterior component to support the holder, wherein
each heat dissipating section is configured to contact the internal frame.

11. The imaging apparatus according to claim 8, further comprising:
a heating body disposed inside the exterior component, the heating body being different from the plurality of image sensors, wherein
heat generated by the heating body is dissipated to the exterior component through a heat-transfer path.

12. The imaging apparatus according to claim 11, further comprising:
an internal frame made of metal and attached to the exterior component, the internal frame configured to support the holder, each heat dissipating section being configured to contact the internal frame, wherein the heating body is a board attached to the internal frame, and the board is different from the board of the plurality of image sensors, and the heat-transfer path includes the internal frame.

13. An imaging apparatus, comprising:

an exterior component;

an image sensor disposed inside the exterior component, the image sensor including a first board;

a heating body disposed inside the exterior component, the heating body being different from the image sensor and heat generated by the heating body is dissipated to the exterior component through a heat-transfer path;

a sheet body configured to dissipate heat generated by the image sensor;

a holder configured to hold the sheet body;

an elastic body being elastically deformable and having thermal conductivity; and an internal frame comprised of metal and attached to the exterior component, the internal frame configured to support the holder, wherein the heating body is a second board attached to the internal frame, the second board is different from the first board, the heat-transfer path includes the internal frame, the sheet body includes:

a heat receiver attached to the board of the image sensor; and a heat dissipating section attached to the elastic body and in contact the internal frame, and the elastic body being held by the holder and being compressively deformable to be compressed directly against an inner surface of the exterior component.

14. The imaging apparatus according to claim 13, wherein the exterior component includes a boss used to attach the second board to the internal frame, and the second board is in contact with the boss.

15. The imaging apparatus according to claim 13, further comprising:

a plate constituting the internal frame; and a battery, wherein the plate is disposed between the second board and the battery.

16. An imaging apparatus, comprising:

an exterior component;

an image sensor disposed inside the exterior component, the image sensor including a board;

a sheet body configured to dissipate heat generated by the image sensor;

a holder configured to hold the sheet body; and an elastic body being elastically deformable and having thermal conductivity, wherein the sheet body includes:

a heat receiver attached to the board of the image sensor; and a heat dissipating section attached to the elastic body, the elastic body being held by the holder and being compressively deformable to be compressed directly against an inner surface of the exterior component, and the holder includes a heat storage body that is in contact with the heat dissipating section.

17. The imaging apparatus according to claim 16, further comprising:

a heating body disposed inside the exterior component, the heating body being different from the image sensor, wherein heat generated by the heating body is dissipated to the exterior component through a heat-transfer path.

18. The imaging apparatus according to claim 17, further comprising:

an internal frame made of metal and attached to the exterior component, the internal frame configured to support the holder, the heat dissipating section being configured to contact the internal frame, wherein the heating body is a board attached to the internal frame, and the board is different from the board of the image sensor, and the heat-transfer path includes the internal frame.

19. The imaging apparatus according to claim 18, wherein the exterior component includes a boss used to attach the board to the internal frame, and the board is in contact with the boss.

20. The imaging apparatus according to claim 19, further comprising:

a plate constituting the internal frame; and a battery, wherein the plate is disposed between the board and the battery.

* * * * *